(12) United States Patent
Kao

(10) Patent No.: US 11,362,169 B2
(45) Date of Patent: *Jun. 14, 2022

(54) CAPACITOR STRUCTURE AND SEMICONDUCTOR STRUCTURE

(71) Applicant: TAIWAN SEMICONDUCTOR MANUFACTURING COMPANY LTD., Hsinchu (TW)

(72) Inventor: Chih-Kuang Kao, Hsin-Chu (TW)

(73) Assignee: TAIWAN SEMICONDUCTOR MANUFACTURING COMPANY LTD., Hsinchu (TW)

(*) Notice: Subject to any disclaimer, the term of this patent is extended or adjusted under 35 U.S.C. 154(b) by 0 days.

This patent is subject to a terminal disclaimer.

(21) Appl. No.: 17/008,200

(22) Filed: Aug. 31, 2020

(65) Prior Publication Data
US 2020/0403063 A1 Dec. 24, 2020

Related U.S. Application Data

(63) Continuation of application No. 16/114,917, filed on Aug. 28, 2018, now Pat. No. 10,763,325.

(51) Int. Cl.
*H01L 49/02* (2006.01)
*H01L 23/522* (2006.01)
*H01L 23/532* (2006.01)

(52) U.S. Cl.
CPC .......... *H01L 28/60* (2013.01); *H01L 23/5222* (2013.01); *H01L 23/5226* (2013.01); *H01L 23/5329* (2013.01)

(58) Field of Classification Search
CPC . H01L 28/60; H01L 23/5226; H01L 23/5222; H01L 23/5329; H01L 23/5223
See application file for complete search history.

(56) References Cited

U.S. PATENT DOCUMENTS

2012/0068237 A1* 3/2012 Booth, Jr. .......... H01L 27/10873
257/296
2016/0020267 A1* 1/2016 Lin ...................... H01L 29/945
257/532

\* cited by examiner

*Primary Examiner* — Julia Slutsker
(74) *Attorney, Agent, or Firm* — WPAT, P.C., Intellectual Property Attorneys; Anthony King

(57) ABSTRACT

A capacitor structure includes an insulative layer, a first electrode over the insulative layer, a dielectric layer over the first electrode, and a second electrode over the dielectric layer. The first electrode includes a first portion extending along a lateral direction of the insulative layer and a second portion connected to the first portion and extending along a depth direction of the insulative layer. The dielectric layer is substantially conformal with respect to a profile of the first electrode. A semiconductor structure thereof and a method for forming the same are also provided.

20 Claims, 25 Drawing Sheets

CAPACITOR STRUCTURE AND SEMICONDUCTOR STRUCTURE

CROSS REFERENCE TO RELATED APPLICATIONS

This application is a continuation of application Ser. No. 16/114,917, filed on Aug. 28, 2018, now allowed, which is incorporated by reference in its entirety.

BACKGROUND

Electronic equipment involving semiconductor devices are essential for many modern applications, Technological advances in materials and design have produced generations of semiconductor devices where each generation has smaller and more complex circuits than the previous generation, Capacitors (also known as condensers) are electrical components used to store potential energy in electrical fields and are designed for enhancing capacitance to a circuit of an electronic and electrical system, such as logic devices, CMOS image sensors (CIS), radio frequency integrated circuits (RFIC), and monolithic microwave integrated circuits (MMIC). Capacitive structures include, for example, metal-oxide-semiconductor (MOS) capacitors, p-n junction capacitors and metal-insulator-metal (MIM) capacitors. An MIM capacitor includes an insulator disposed between a lower and an upper electrode plates. The desired capacitance density is usually increased with increased integrated circuit density in dimension scaling. The capacitance density, however, may not be simply increased by increasing planar area of stacked MIM due to area conservation for contact vias.

BRIEF DESCRIPTION OF THE DRAWINGS

Aspects of the embodiments of the present disclosure are best understood from the following detailed description when read with the accompanying figures. It is noted that, in accordance with the standard practice in the industry, various structures are not drawn to scale. In fact, the dimensions of the various structures may be arbitrarily increased or reduced for clarity of discussion.

DETAILED DESCRIPTION

Figure 1:
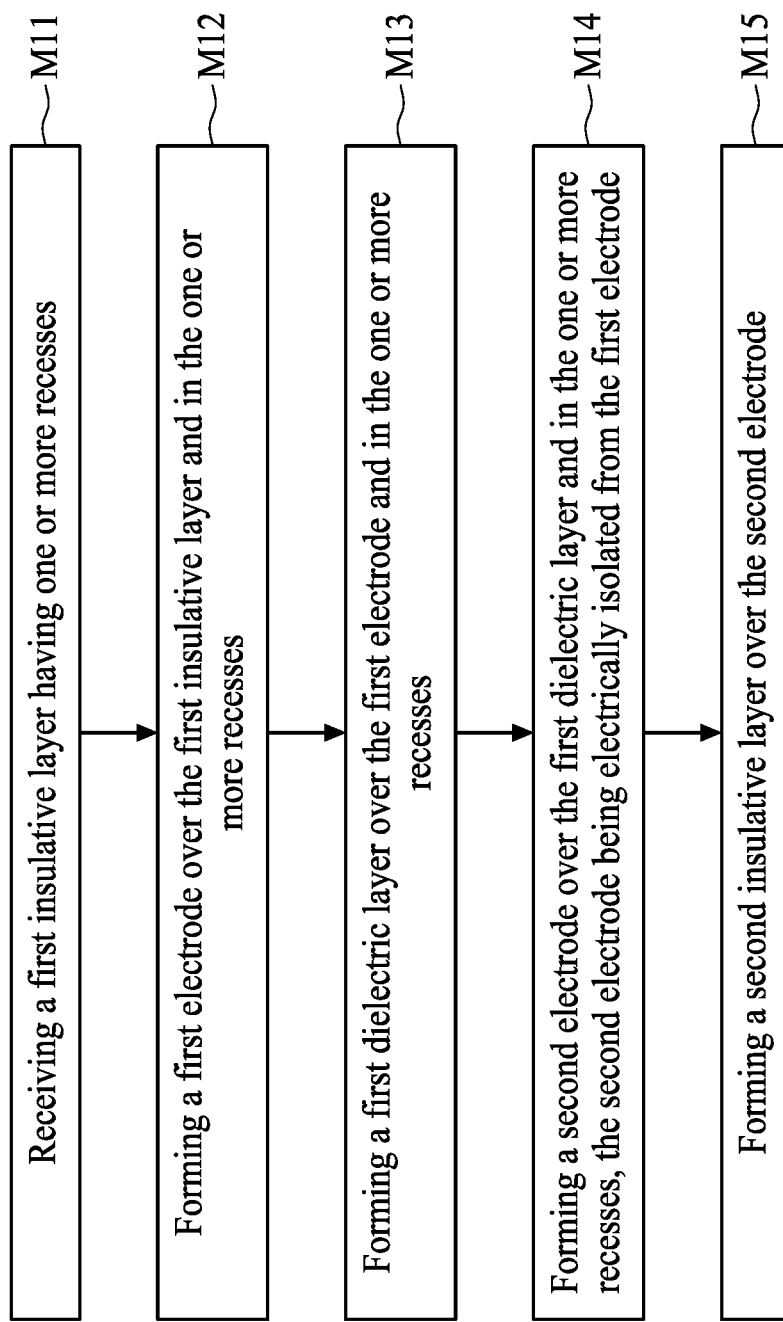
FIG. 1 is a flow chart illustrating a method for manufacturing a capacitor structure according to various aspects of one or more embodiments of the present disclosure.

The following disclosure provides many different embodiments, or examples, for implementing different features of the provided subject matter. Specific examples of elements and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "over," "upper," "on," and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As used herein, the terms such as "first," "second" and "third" describe various elements, components, regions, layers and/or sections, these elements, components, regions, layers and/or sections should not be limited by these terms. These terms may be only used to distinguish one element, component, region, layer or section from another. The terms such as "first," "second" and "third" when used herein do not imply a sequence or order unless clearly indicated by the context.

As used herein, the terms "approximately," "substantially," "substantial" and "about" are used to describe and account for small variations. When used in conjunction with an event or circumstance, the terms can refer to instances in which the event or circumstance occurs precisely as well as instances in which the event or circumstance occurs to a close approximation. For example, when used in conjunction with a numerical value, the terms can refer to a range of variation of less than or equal to ±10% of that numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, two numerical values can be deemed to be "substantially" the same or equal if a difference between the values is less than or equal to ±10% of an average of the values, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, "substantially" parallel can refer to a range of angular variation relative to 0° that is less than or equal to ±10°, such as less than or equal to ±5°, less than or equal to ±4°, less than or equal to ±3°, less than or equal to ±2°, less than or equal to ±1°, less than or equal to ±0.5°, less than or equal to ±0.1°, or less than or equal to ±0.05°. For example, "substantially" perpendicular can refer to a range of angular variation relative to 90° that is less than or equal to ±10°, such as less than or equal to ±5°, less than or equal to ±4°, less than or equal to ±3°, less than or equal to ±2°, less than or equal to ±1°, less than or equal to ±0.5°, less than or equal to ±0.1°, or less than or equal to ±0.05°.

Some embodiments of the present disclosure provide a capacitor structure, a semiconductor structure thereof and a method for manufacturing the same. The capacitor structure includes a capacitor extending along a lateral direction and also a depth direction over a base material and thus to increase capacitance of the capacitor in a semiconductor structure. The base material may include insulative material, dielectric material, semiconductive material or the like.

Referring to FIG. 1, the method provided by some embodiments of the present disclosure includes operation M11 in which a first insulative layer having one or more recesses is received. The method proceeds with operation M12 in which a first electrode is formed over the first insulative layer and in the one or more recesses. The method continues with operation M13 in which a first dielectric layer is formed over the first electrode and in the one or more recesses. The method proceeds with operation M14 in which a second electrode is formed over the first dielectric layer and in the one or more recesses, wherein the second electrode is electrically isolated from the first electrode. The method continues with operation M15 in which a second insulative layer is formed over the second electrode.

The method is for illustrating concepts of the present disclosure, and is not intended to limit the present disclosure beyond what is explicitly recited in the claims. Additional operations can be provided before, during, and after the method illustrated above and in FIG. 1, and some operations described can be replaced, eliminated, or moved around for additional embodiments of the method.

Figure 2:
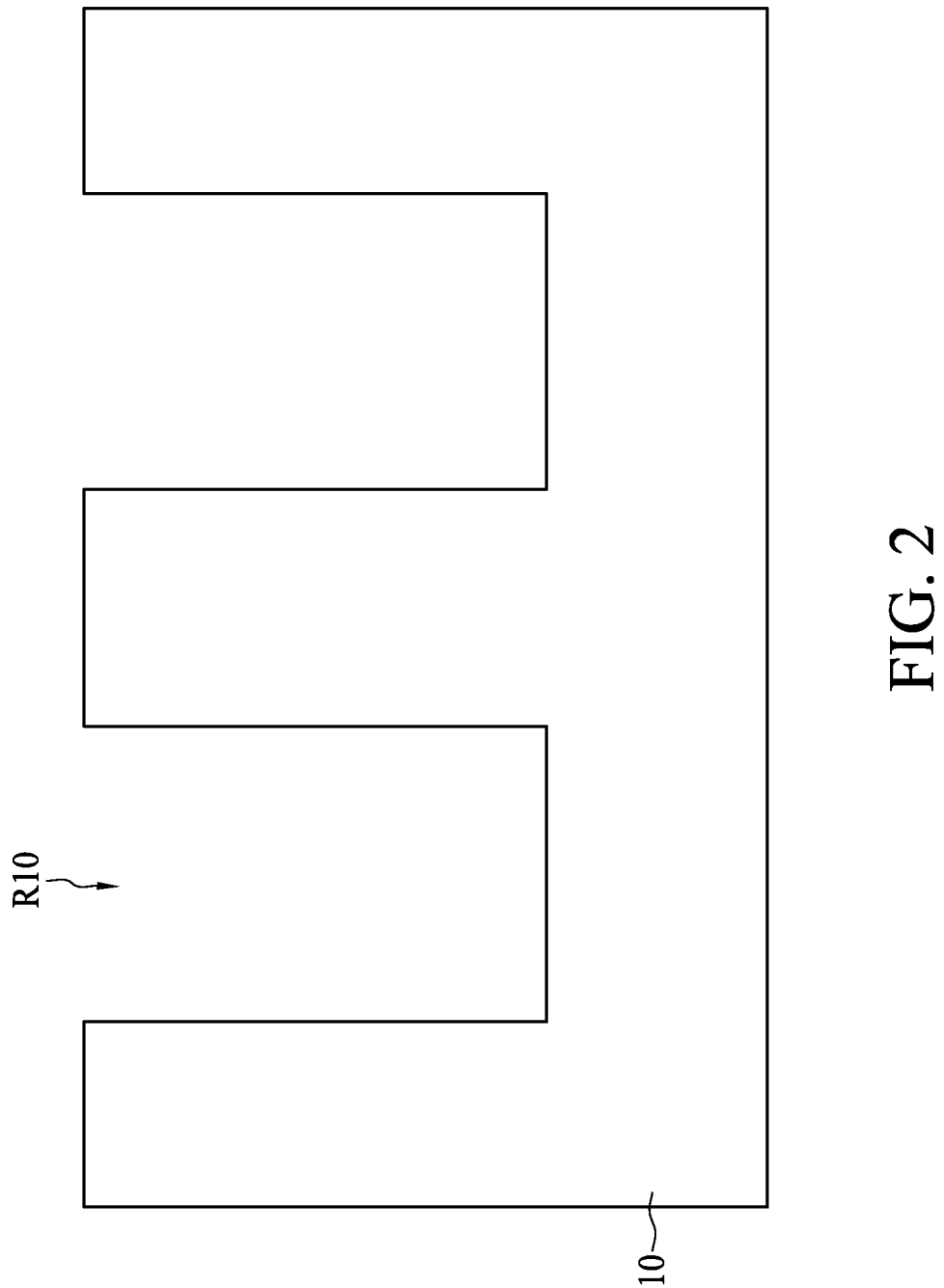
FIGS. 2-9 are schematic cross sectional views at one of various operations of manufacturing a capacitor structure according to one or more embodiments of the present disclosure.

FIGS. 2-9 are schematic cross sectional views at one of various operations of manufacturing a capacitor structure 100 including a capacitor 30 according to one or more embodiments of the present disclosure. Referring to FIG. 2, an insulative layer 10 having one or more recesses R10 is received. The insulative layer 10 can include materials commonly used in an inter-metal dielectric layer, e.g. silicon oxide, silicon nitride, or other suitable dielectric or insulative materials. The recesses R10 can be formed by various patterning operations such as wet etching and dry etching techniques and it is not limited herein.

Figure 3:
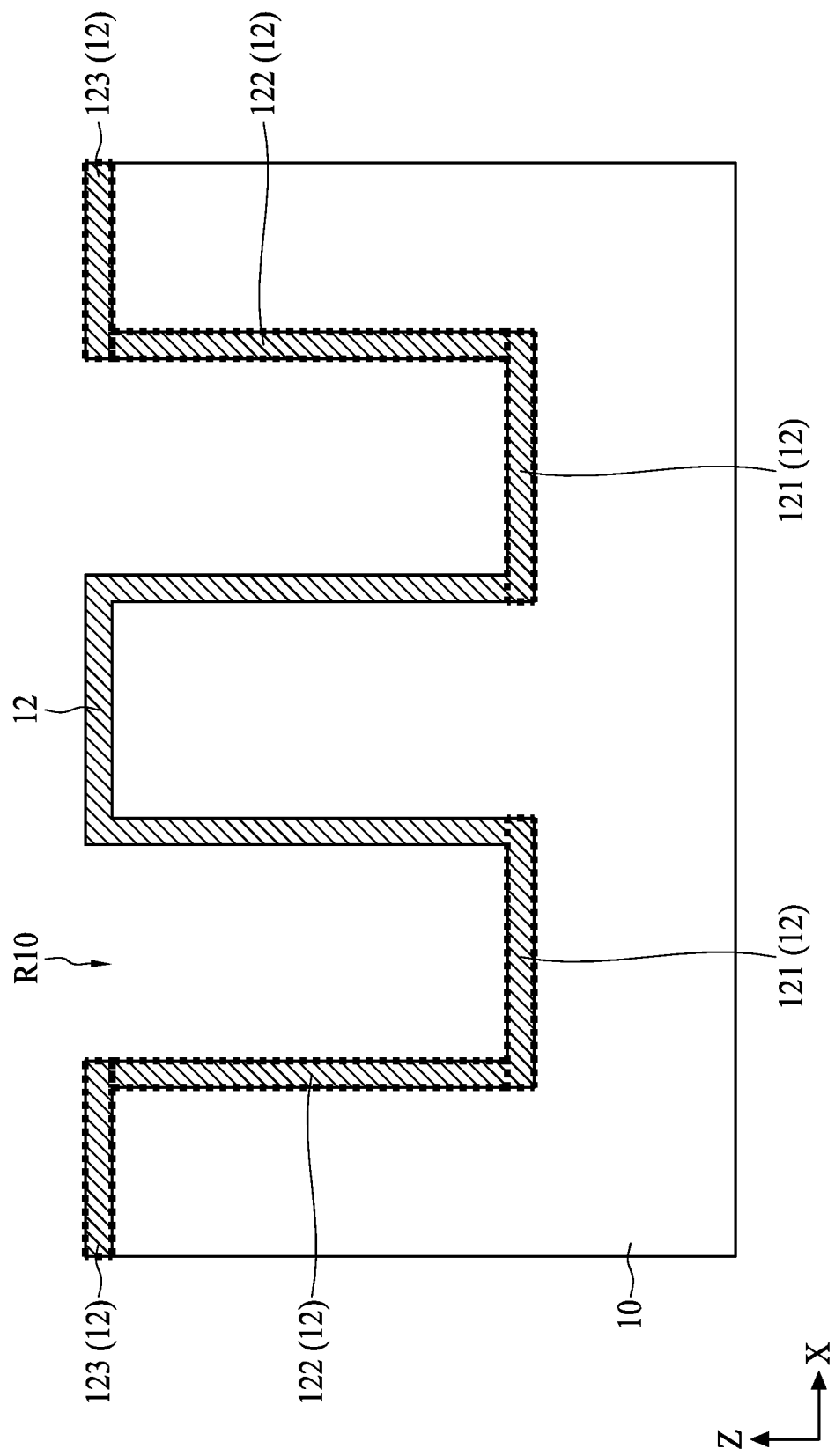

Referring to FIG. 3, an electrode 12 is formed over the insulative layer 10 and in the recesses R10. In some embodiments, the material of the electrode 12 includes metal, such as copper (Cu), aluminum (Al), tungsten (W), other suitable metal, or alloy, e.g. aluminum-copper (Al—Cu) alloy. In some embodiments, the material of the electrode 12 includes metal compound such as titanium nitride (TiN), tantalum nitride (TaN), or other suitable metal compounds. The electrode 12 may be a single-layered or multi-layered structure with single or combined materials as illustrated above. The electrode 12 may be formed over the insulative layer 10 by physical vapor deposition (PVD), chemical vapor deposition (CVD), atomic layer deposition (ALD) or any other suitable operations. The electrode 12 includes a portion 121, a portion 122 and a portion 123. The portion 121 extends along a lateral direction X of the insulative layer 10; the portion 122 is connected to the portion 121 and extends along a depth direction Z of the insulative layer 10; and the portion 123 is connected to the portion 122 and extends along the lateral direction X. The portion 123 and the portion 121 are disposed at different levels and substantially parallel to each other. The portions 121, 122 and 123 have substantially equal thickness over the insulative layer 10, and the electrode 12 is substantially conformal to a profile of the insulative layer 10. That is, the electrode 12 as a whole preserves the profile and extends along the profile of the insulative layer 10.

Figure 4:
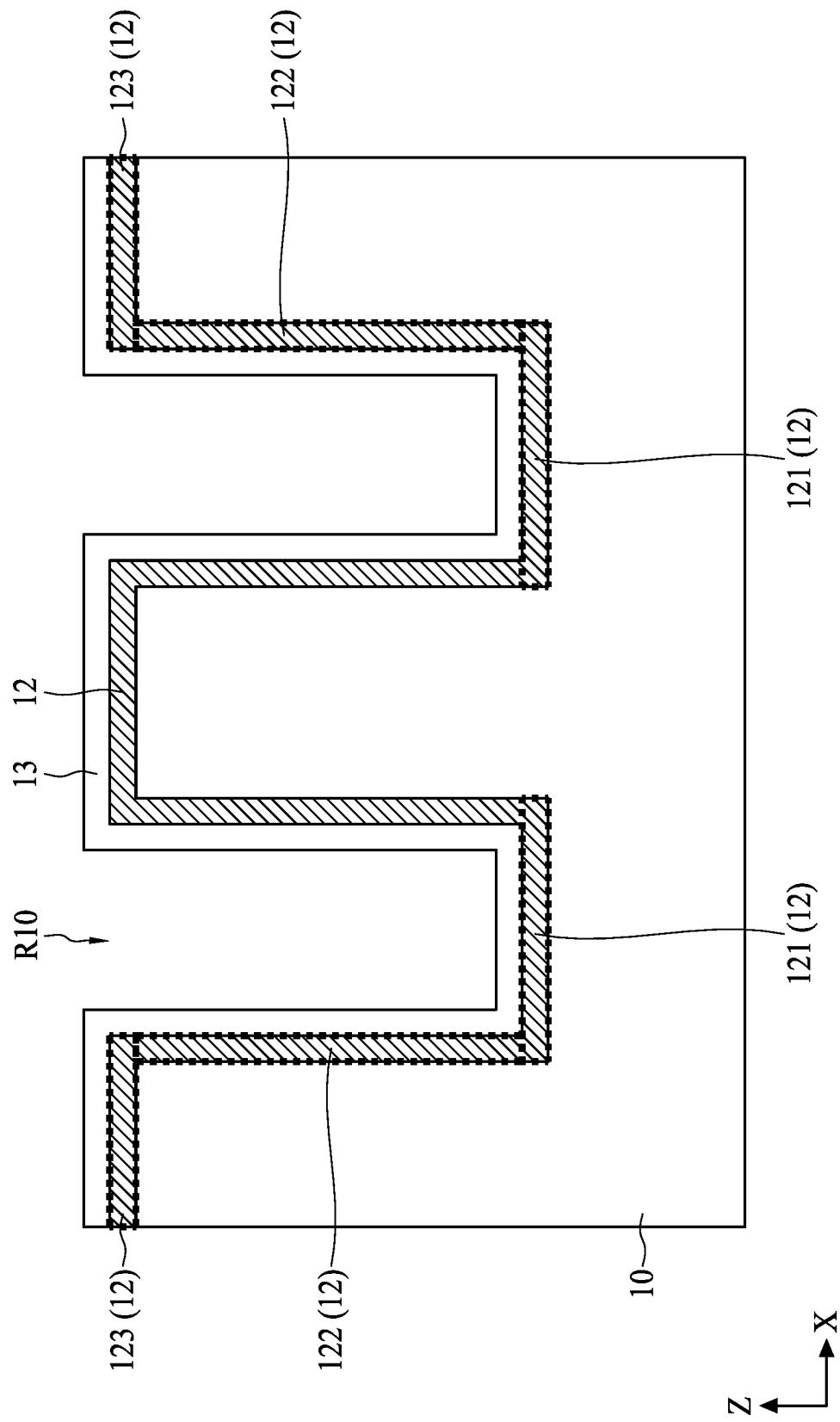

Referring to FIG. 4, a dielectric layer 13 is formed over the electrode 12 and in the recesses R10. In some embodiments, the material of the dielectric layer 13 may include high-k dielectric material (i.e., a dielectric material having a dielectric constant greater than silicon dioxide). In some embodiments, the material of the dielectric layer 13 may include low-k dielectric material (i.e., a dielectric material having a dielectric constant equal to or less than silicon dioxide). By way of examples, the material of the dielectric layer 13 includes silicon oxide, silicon nitride, aluminum oxide, silicon oxynitride, tantalum oxide, titanium oxide, zirconium oxide, hafnium oxide, lanthanum oxide, strontium titanate or any other suitable low-k or high-k dielectric materials. The dielectric layer 13 may be formed over the conductive layer 12 by atomic layer deposition (ALD), chemical vapor deposition (CVD) or any other suitable operations. The dielectric layer 13 is substantially conformal to a profile of the electrode 12. That is, the dielectric layer 13 as a whole preserves the profile and extends along the profile of the electrode 12. The dielectric layer 13 and the electrode 12 together as a whole are substantially conformal to the profile of the insulative layer 10.

Figure 5:
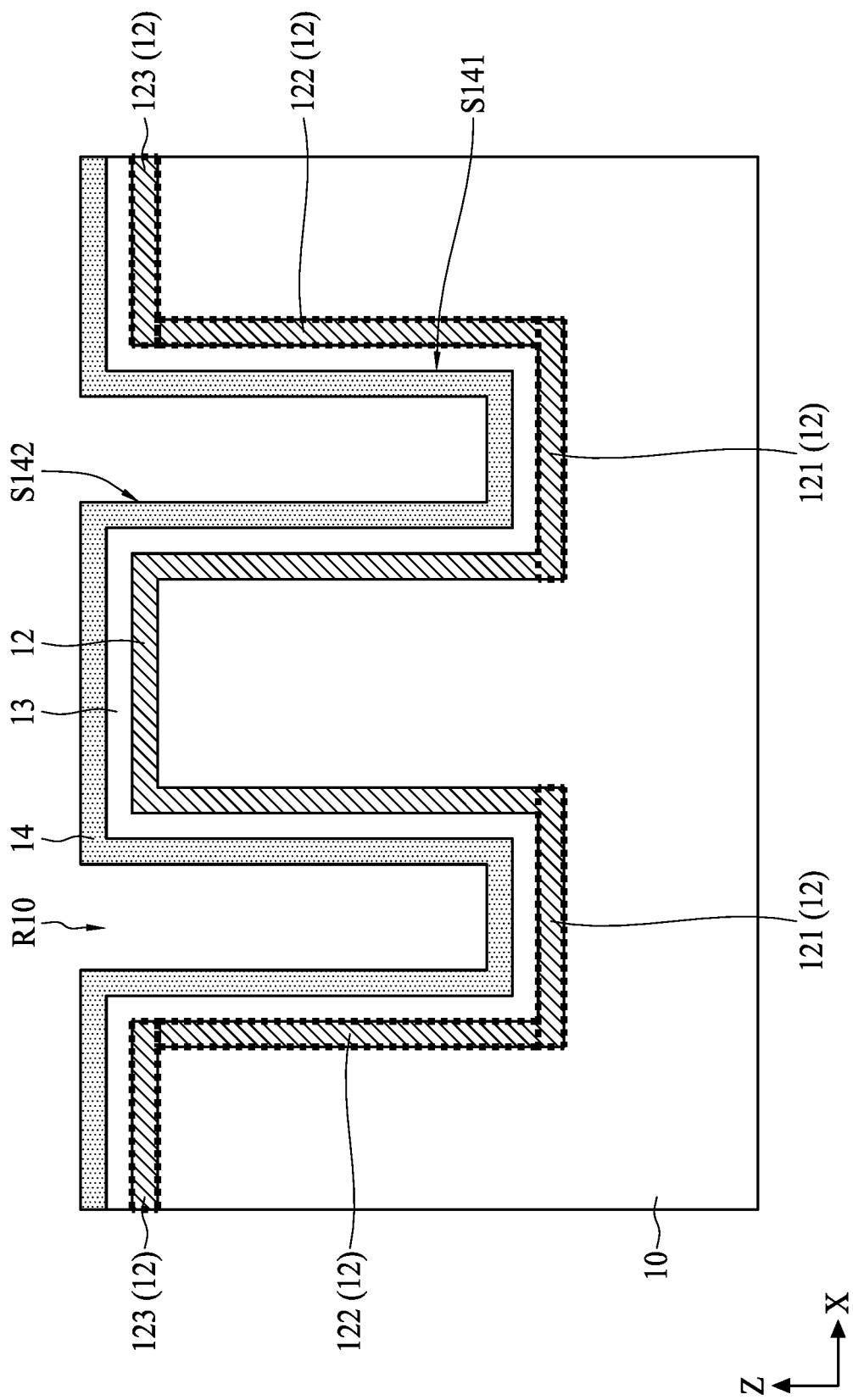

Referring to FIG. 5, another electrode 14 is formed over the dielectric layer 13 and in the recesses R10. In some embodiments, the material of the electrode 14 includes metal, such as copper (Cu), aluminum (Al), tungsten (W), other suitable metal, or alloy, e.g. aluminum-copper (Al—Cu) alloy. In some embodiments, the material of the electrode 14 includes metal compound such as titanium nitride, tantalum nitride, or other suitable metal compounds. The electrode 14 may be a single-layered or multi-layered structure with single or combined materials as illustrated above. The electrode 14 may be formed over the dielectric layer 13 by physical vapor deposition (PVD), chemical vapor deposition (CVD), atomic layer deposition (ALD) or any other suitable operations. The material and fabricating operation of the electrode 14 can be the same or different from those of the electrode 12. At least a surface of the electrode 14 is substantially conformal to a profile of the dielectric layer 13. That is, at least one surface of the electrode 13 preserves the profile and extends along the profile of the dielectric layer 13.

In some embodiments, the electrode 12, the dielectric layer 13 and the electrode 14 together as a whole are substantially conformal to the profile of the insulative layer 10. As shown in FIG. 5, the electrode 14 has a surface S141 proximal to the dielectric layer 13 and a surface S142 distal to the dielectric layer 13. The surface S141 and the surface S142 of the electrode 14 are substantially conformal with respect to a profile of the dielectric layer 13.

The portion 121 is disposed at and along the bottom of the recesses R10, and the portion 123 is disposed on the insulative layer 10 and outside the recesses R10. In some embodiments, the lateral direction X and the depth direction Z are substantially perpendicular to each other. In some embodiments, the portion 121 and the portion 122 may be non-perpendicular to each other. An angle between the portion 121 and the portion 122 can be varied in different embodiments depending on different requirements and parameters of operations for forming the recesses R10, and it is not limited herein.

Figure 6:
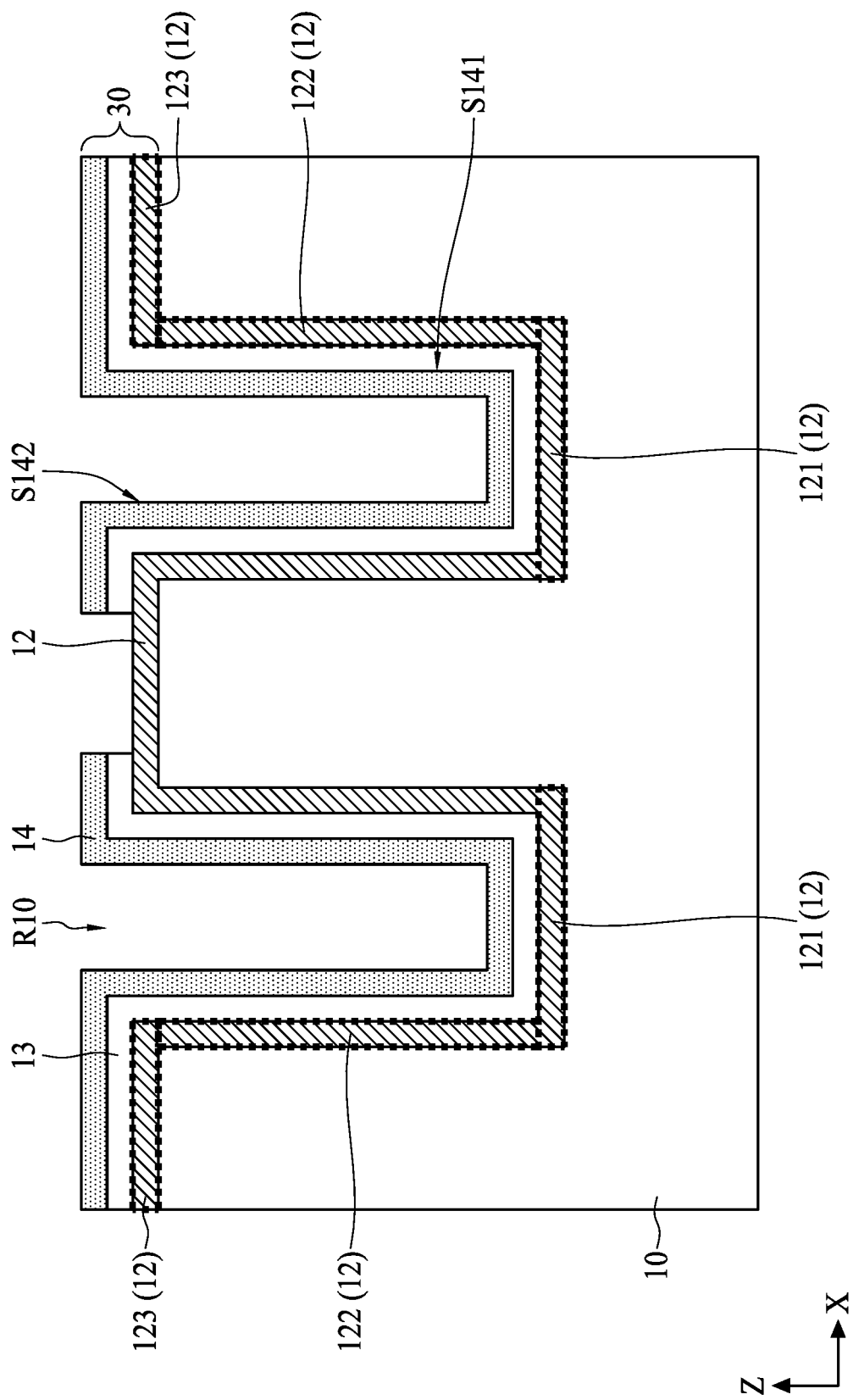
Figure 7:
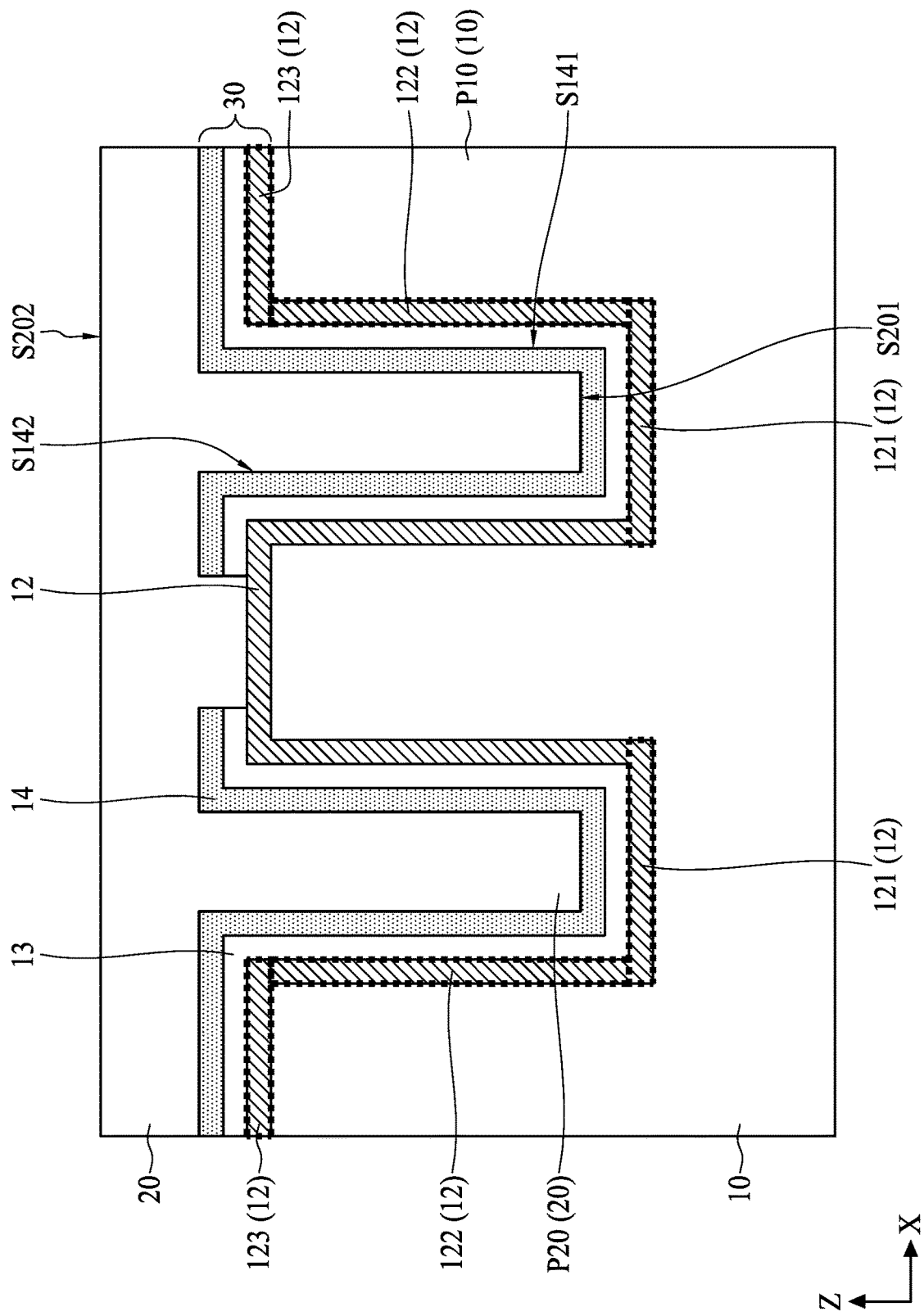
Figure 8:
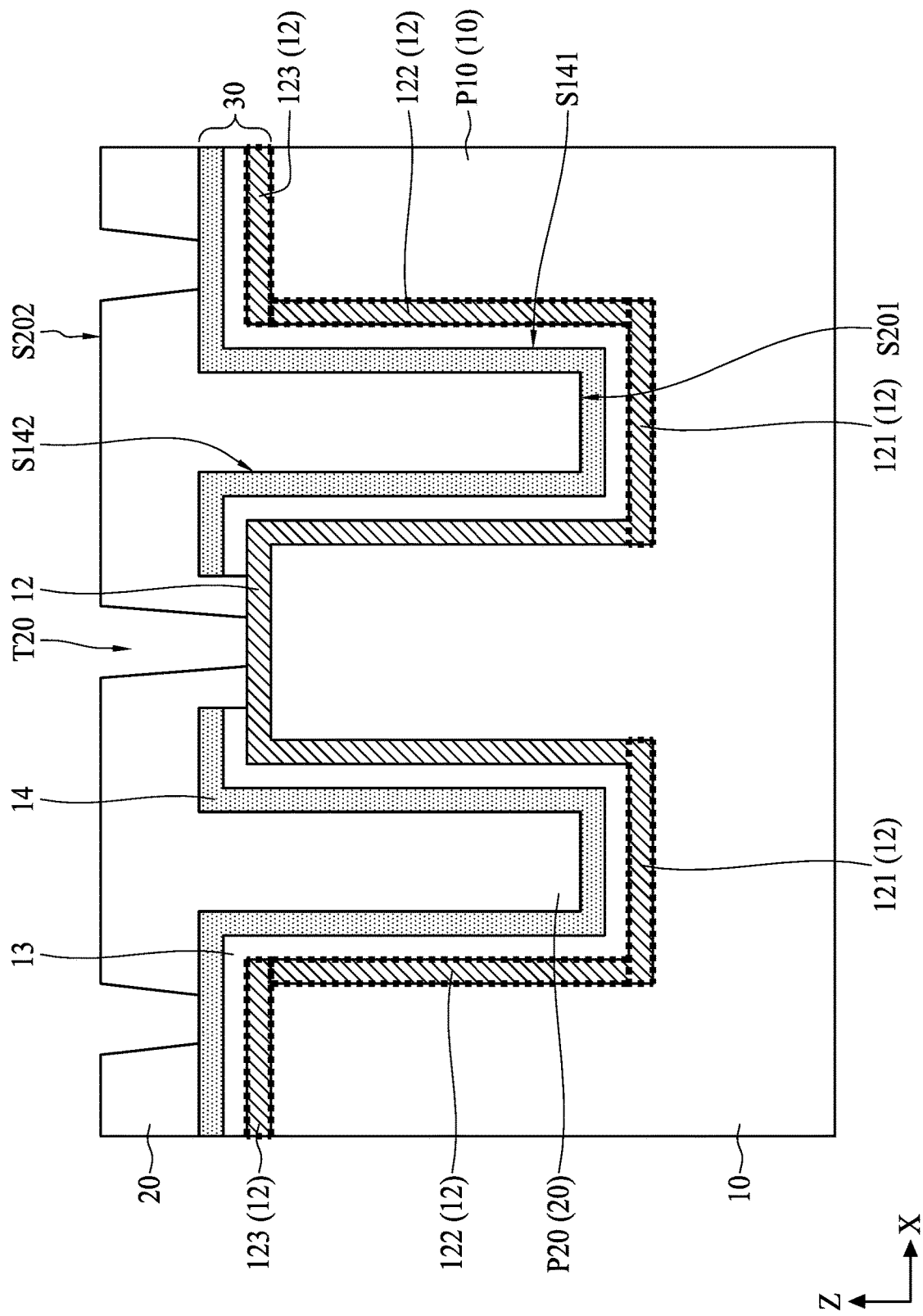
Figure 9:
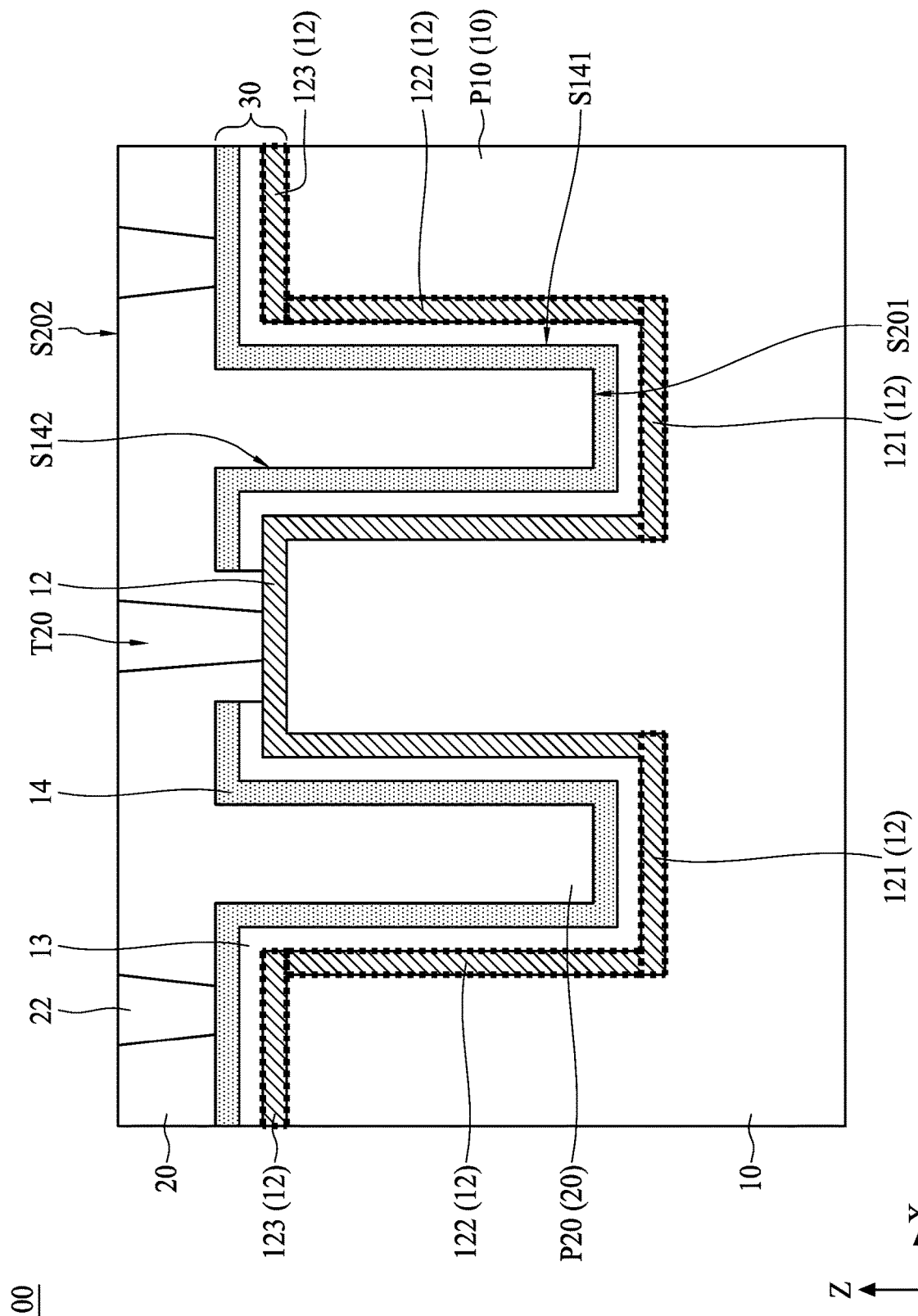

Referring to FIG. 6, the dielectric layer 13 and the electrode 14 are patterned to reveal a portion of the electrode 12. Another insulative layer 20 is formed over the insulative layer 10 to cover the electrode 12, the dielectric layer 13 and the electrode 14 as shown in FIG. 7. In some embodiments, a surface of the insulative layer 20, e.g., a surface S201 proximal to the electrode 14, is substantially conformal with respect to a profile of the electrode 12, the dielectric layer 13 and the electrode 14, and a surface S202 distal to the electrode 14 is a substantially flat surface. In some embodiments, at least a protrusion P20 of the insulative layer 20 is inserted into the recesses R10 of the insulative layer 10. The protrusion P20 is engaged with at least a protrusion P10 of the insulative layer 10. Shapes of the protrusions P10 and P20 are not limited herein. As shown in FIG. 8, the insulative layer 20 is patterned to reveal the portion of the electrode 12 and a portion of the electrode 14 by a plurality of trenches T20. Proceeding to FIG. 9, a plurality of conductive vias 22 is formed in the plurality of trenches T20 in the insulative layer 20 to electrically connect with the electrode 12 and the electrode 14. FIG. 9 shows a portion of a cross sectional view of the capacitor structure 100, and the conductive vias 22 connected with the electrode 14 (on the right hand and left hand sides of the FIG. 9) may be electrically connected together by conductive wire or the like.

Therefore, the capacitor structure 100 is provided. The capacitor structure 100 includes the insulative layer 10, the insulative layer 20, the capacitor 30, and a plurality of conductive vias 22. The insulative layer 10 has one or more protrusions P10. The insulative layer 20 is disposed over the insulative layer 10, and the insulative layer 20 has one or more protrusions P20 engaged with the protrusions P10 of the insulative layer 10. The capacitor 30 is located between the insulative layer 10 and the insulative layer 20. The capacitor 30 includes the electrode 12, the electrode 14 and the dielectric layer 13. The dielectric layer 13 is interposed between the two adjacent electrode 12 and electrode 14. The electrode 12 and the electrode 14 are electrically isolated from each other by the dielectric layer 13. The capacitor 30 is substantially conformal to a profile of the insulative layer 10 and a profile of the insulative layer 20. The plurality of conductive vias 22 is electrically connected with the electrode 12 and the electrode 14.

Figure 10:
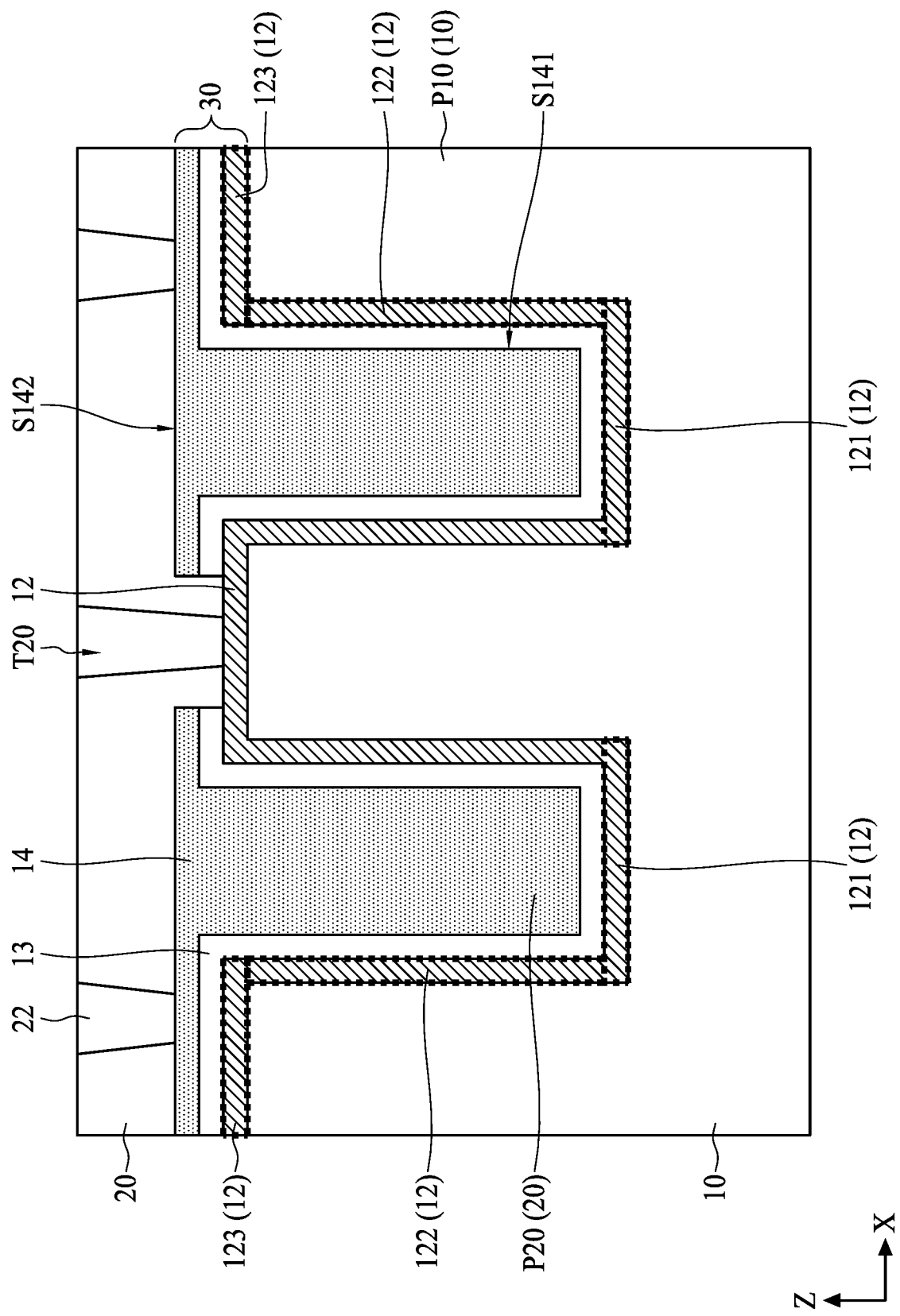
FIG. 10 is a schematic cross sectional view of a capacitor structure according to some embodiments of the present disclosure.

FIG. 10 is a schematic cross sectional view of a capacitor structure according to some embodiments of the present disclosure. As shown in FIG. 10, the electrode 14 may fill up the recesses R10 in the operation of formation of the electrode 14. In some embodiments, the electrode 14 has a surface S141 proximal to the dielectric layer 13 and a surface S142 distal to the dielectric layer 13, wherein the surface S141 of the electrode 14 is substantially conformal with respect to a profile of the dielectric layer 13, and the surface S142 is a substantially flat surface.

Figure 11:
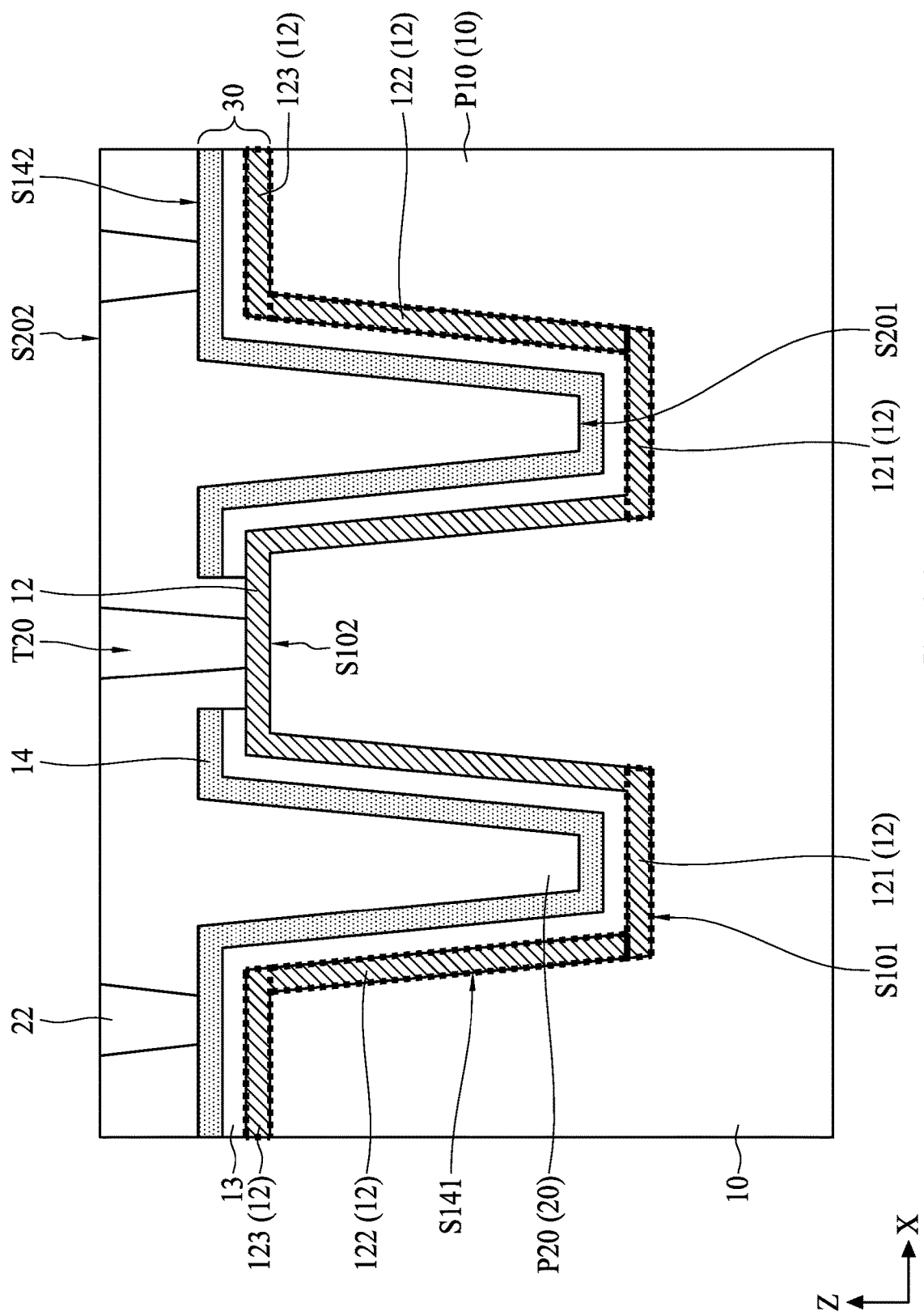
FIG. 11 is a schematic cross sectional view of a capacitor structure according to some embodiments of the present disclosure.

FIG. 11 is a schematic cross sectional view of a capacitor structure according to some embodiments of the present disclosure. As shown in FIG. 11, the portion 122 may extend from a top surface S102 of the insulative layer 10 toward a bottom surface S101 of the insulative layer 10. The portion 123 extends along the top surface S102 of the insulative layer 10 and substantially parallel to the portion 121. The portion 122 may be inclined with respect to the portion 121 and the portion 123. The shapes of protrusions P10 and P20 can be varied depending on the shape of the recesses R10.

Figure 12:
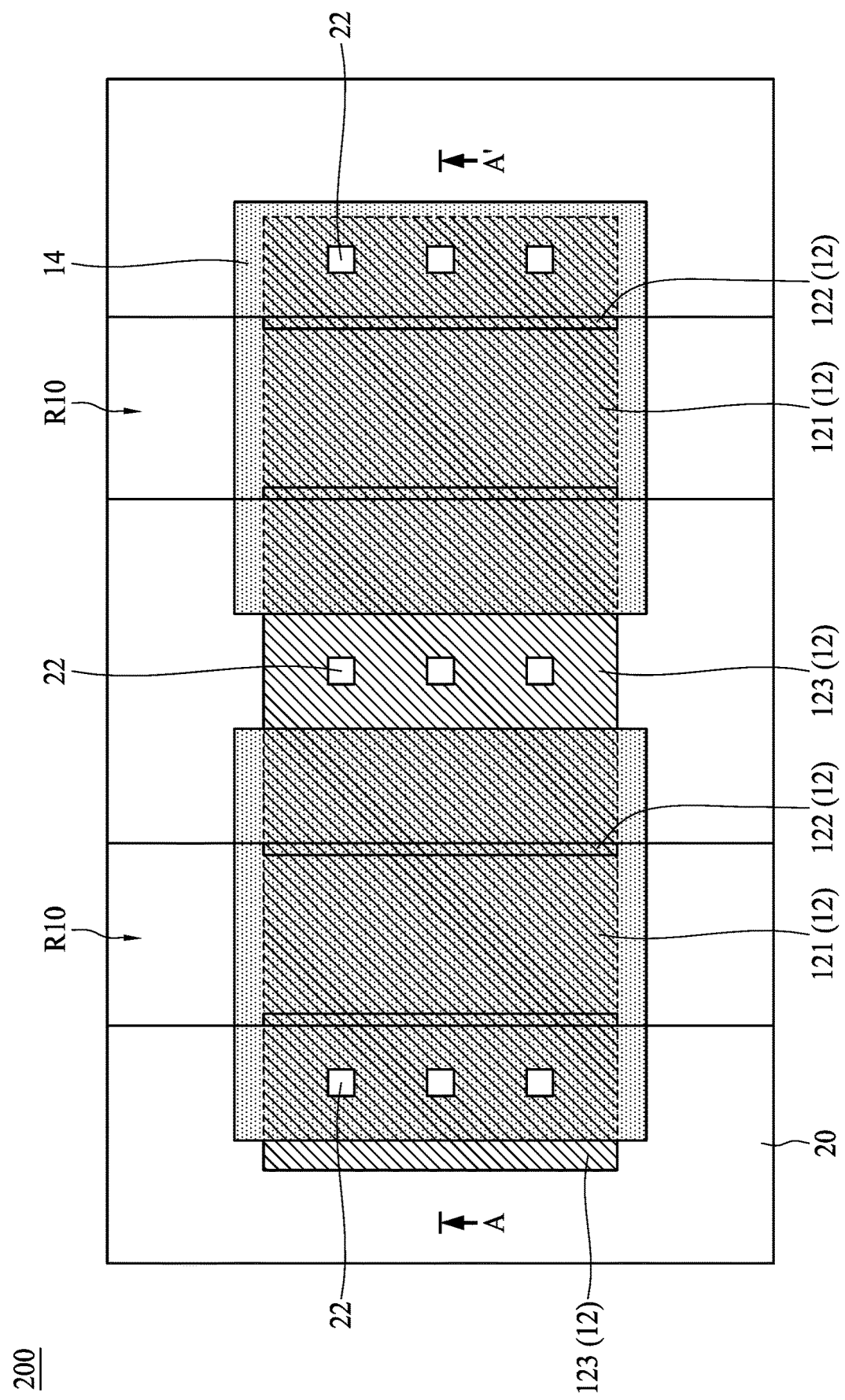
FIGS. 12-13 are schematic top views of capacitor structures according to different embodiments of the present disclosure.
Figure 13:
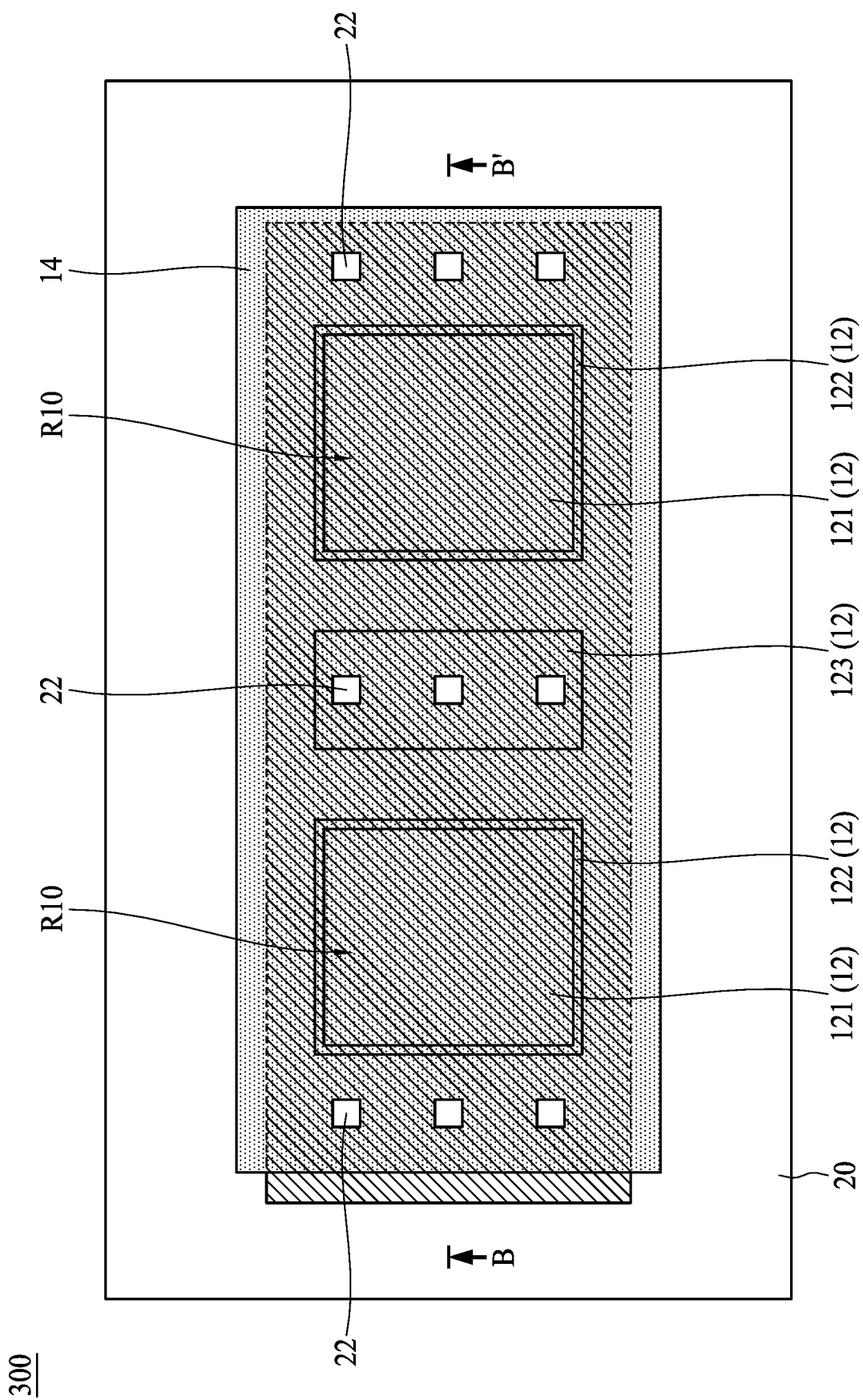

Moreover, depths, widths, lengths, and shapes of the recesses R10 are not limited herein. FIGS. 12-13 are top structural views of a capacitor structure 200 and a capacitor structure 300 in accordance with different embodiments of the present disclosure. The capacitor structure 200 shown in FIG. 12 and the capacitor structure 300 shown in FIG. 13 can be fabricated following afore illustrated method and can share a same cross sectional view, as shown in FIG. 9 for instance. Referring to FIG. 12, the plurality of recesses R10 of the capacitor structure 200 has an elongated configuration. The electrode 12 and the electrode 14 both traverse at least one of the plurality of recesses R10, and the recesses R10 are across the electrode 12 and the electrode 14. The portion 122 of the electrode 12 is discontinuously formed (or separated) on two opposite inner sidewalls of one of the plurality of recesses R10 from the top view perspective. In some embodiments, the dielectric layer 13 is covered by the electrode 14 from the top view perspective as shown in FIG. 12. The dielectric layer 13 covers and is substantially conformal with respect to a profile of a portion of the portion 123 (covered by the electrode 14), the portion 121 and the portion 122 of the electrode 12. The electrode 14 is segregated into two separated portions as shown in FIG. 12 to reveal the portion of the electrode 12 for connection with conductive vias 22. At least one of the plurality of conductive vias 22 is disposed on and electrically connected to another portion of the portion 123 (the portion of the portion 123 exposed from the electrode 14) of the electrode 12. At least one of the plurality of conductive vias 22 is disposed on and electrically connected to the electrode 14. A cross sectional view of the capacitor structure 200 along a line A-A' is similar to FIG. 9.

Referring to FIG. 13, the plurality of recesses R10 of the capacitor structure 300 has a rectangular configuration from a top view perspective. The electrode 12 and the electrode 14 both traverse at least one of the plurality of recesses R10 in all directions, and the recesses R10 are covered by the electrode 12 and the electrode 14. The portion 122 of the electrode 12 is continuously formed on inner sidewalls of the plurality of recesses R10, and the portion 122 of the electrode 12 is a hallow rectangle from the top view perspective as shown in FIG. 13. The dielectric layer 13 is covered by the electrode 14 and has a same configuration of the electrode 14. A portion of the electrode 14 is removed to reveal enough area of a portion of the electrode 12 for connection with the conductive vias 22. In contract with the capacitor structure shown in FIG. 12, the electrode 14 is not segregated into portions but continuously disposed on the plurality of recesses R10. A cross sectional view of the capacitor structure 300 along a line B-B is similar to FIG. 9. In other embodiments, the recesses R10 can be other shapes, such as a circle and a square.

Figure 14:
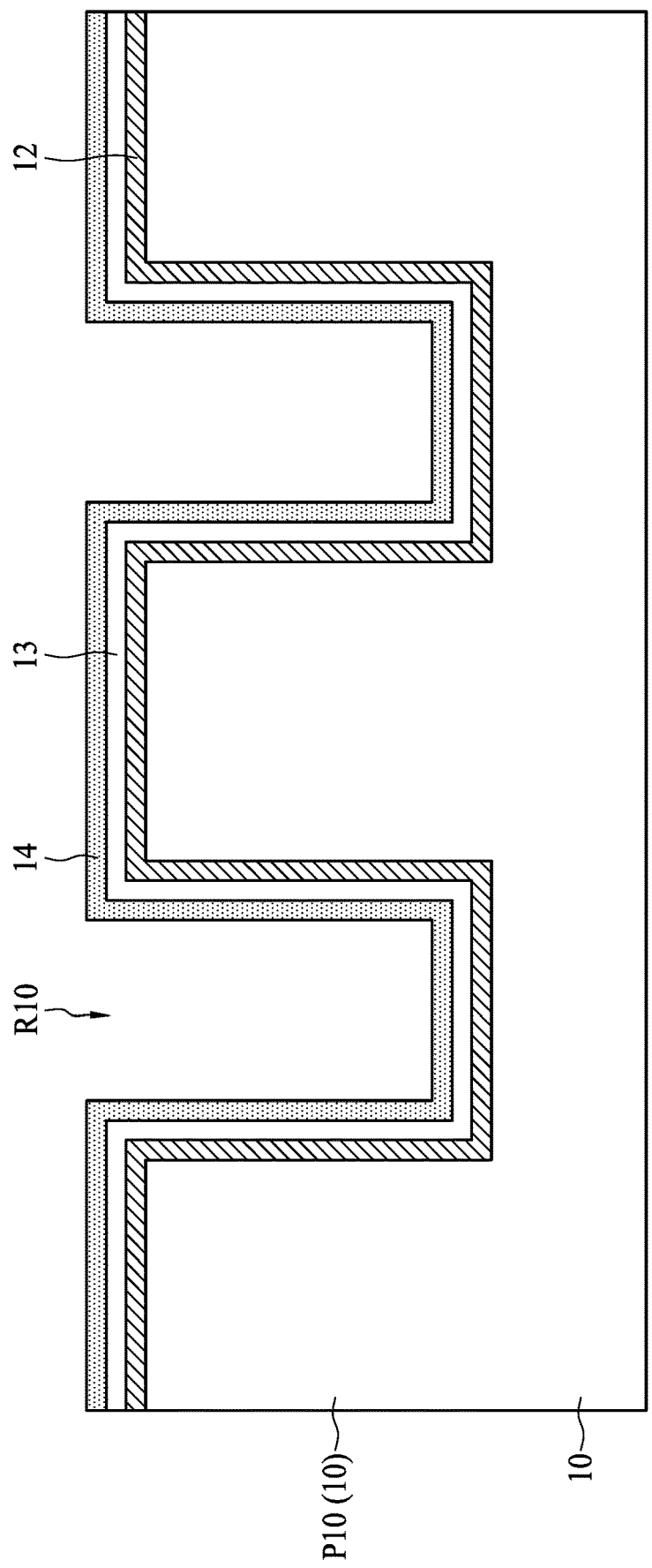
FIGS. 14-21 are schematic cross sectional views at one of various operations of manufacturing a capacitor structure according to one or more embodiments of the present disclosure.

In some embodiments, the capacitor 30 can further include another dielectric layer 15 and another electrode 16, which are formed over the electrode 14, to further enhance capacitance of the capacitor structure. Similar operations to those illustrated in FIGS. 2-5 are performed to form an intermediate cross sectional structure as shown in FIG. 14 in accordance with an embodiment of the present disclosure. Reference numerals and/or letters are repeatedly used in the figures on elements with same or similar properties and/or functions, and it does not intend to limit the present disclosure.

Figure 15:
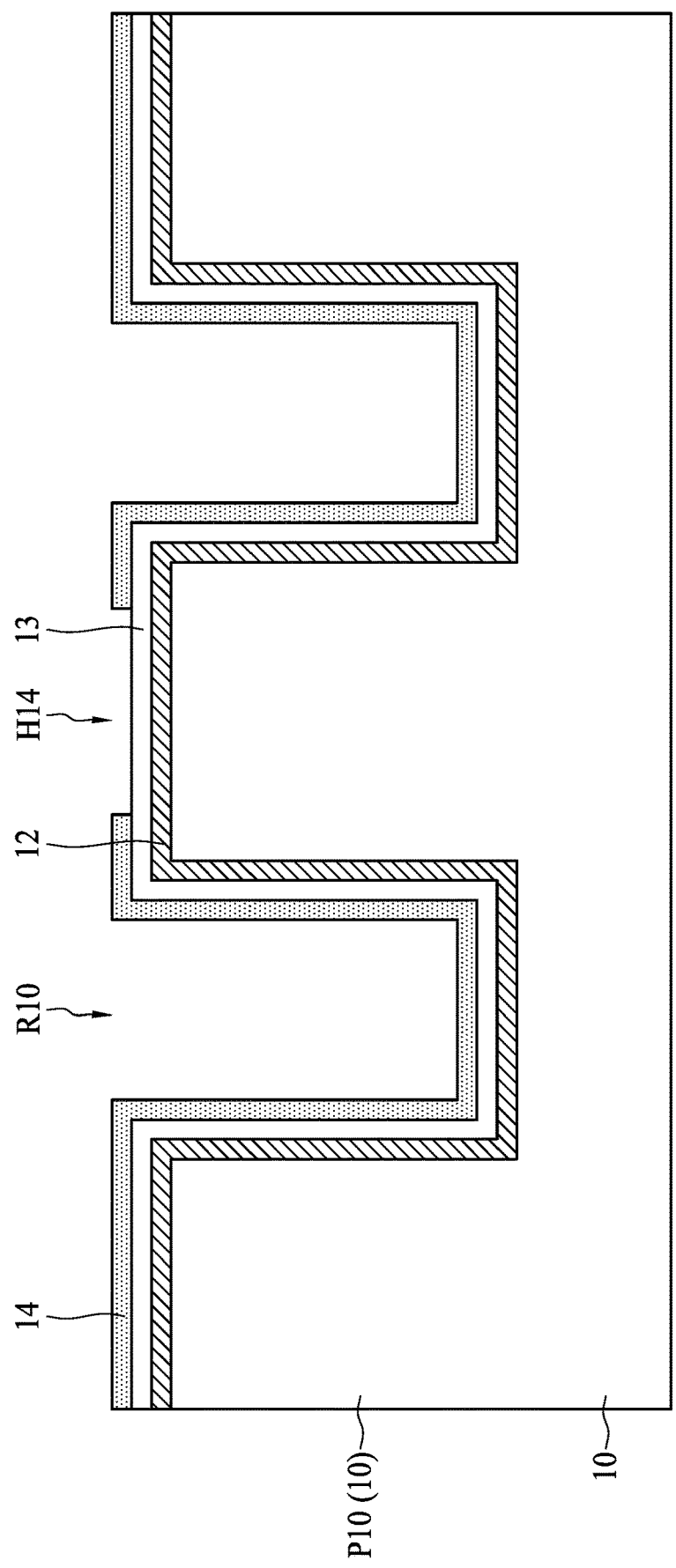
Figure 16:
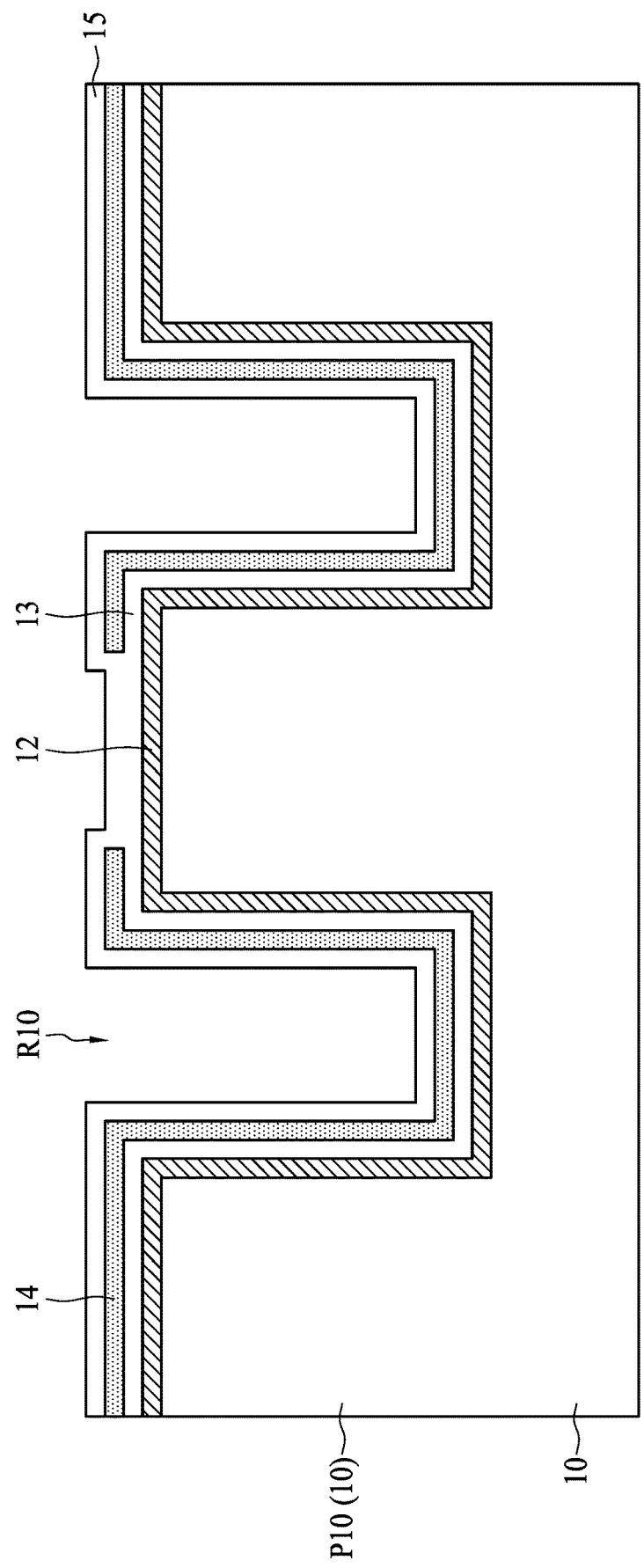
Figure 17:
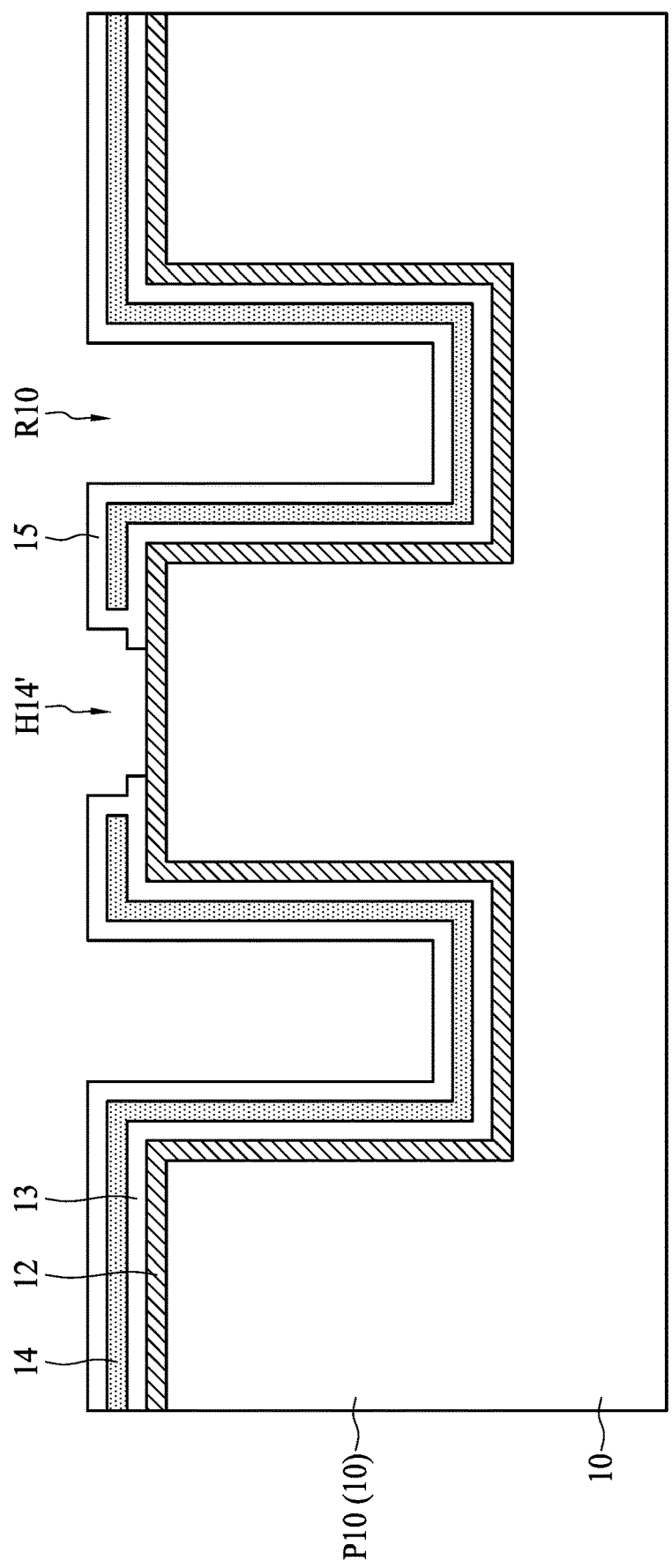

Following the cross section shown in FIG. 14, in accordance with some embodiments for forming a capacitor structure 400 of the present disclosure, the electrode 14 is patterned to remove a portion of the electrode 14 to form an opening H14. A portion of the dielectric layer 13 is revealed as shown in FIG. 15. In other embodiments, the portion of the dielectric layer 13 is also removed to reveal a portion of the electrode 12. A dielectric layer 15 is formed over the electrode 14 and in the recesses R10 as shown in FIG. 16. The dielectric layer 15 substantially conformal with respect to a profile of the electrode 14. The dielectric layer 15 is formed also in the opening H14. A portion of the dielectric layer 13 and a portion of the dielectric layer 15 at the bottom of the opening H14 is removed to reveal the portion of the electrode 12 as shown in FIG. 17. It should be noted that in some embodiments the electrode 12 is revealed in the operation of patterning the electrode 14. However in the operation for forming the dielectric layer 15, the dielectric layer 15 is formed over and covers the portion of the electrode 12 in the opening H14. In those embodiments, a portion of the dielectric layer 15 at the bottom of the opening H14 is removed to reveal the portion of the electrode 12, and a cross section thereof looks similar to FIG. 17. An opening H14' is formed as shown in FIG. 17, and the opening H14' is defined by a portion of the electrode 12, a portion of the dielectric layer 13, and a portion of the dielectric layer 15.

Figure 18:
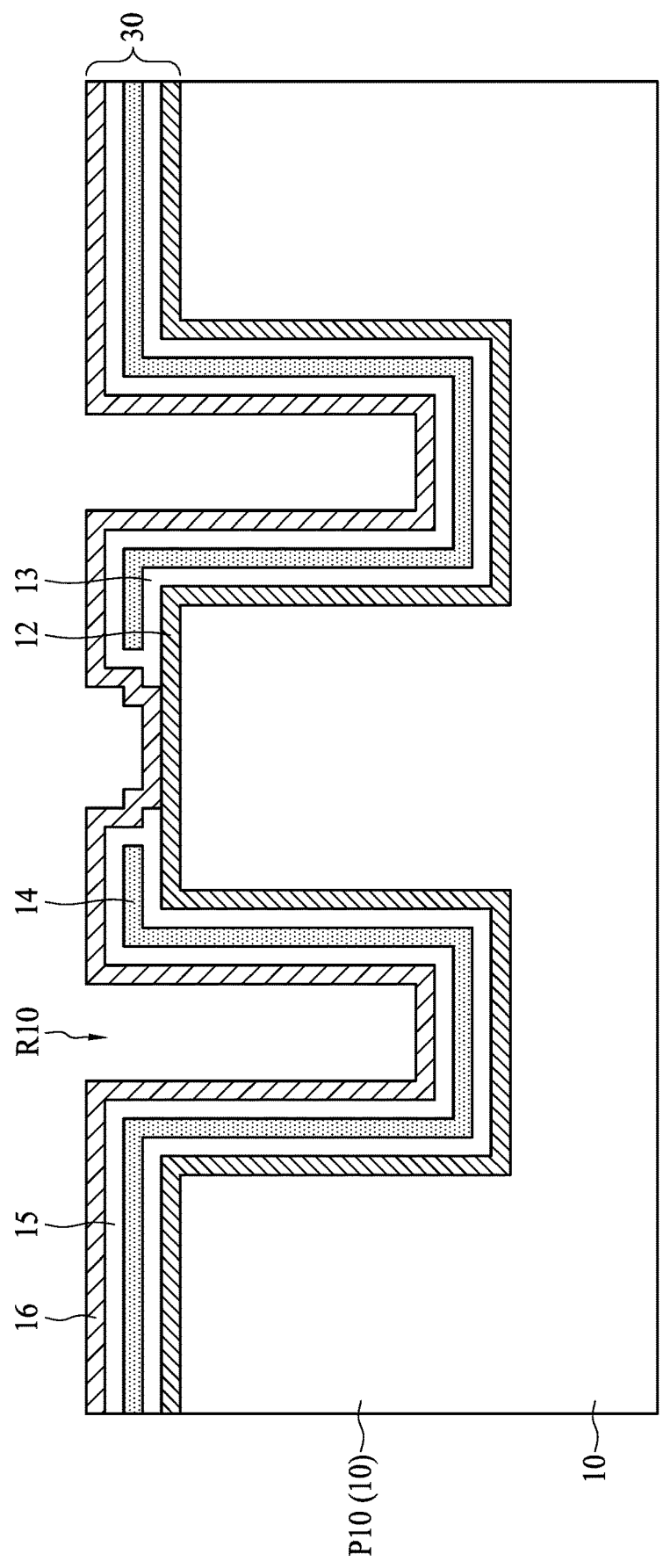
Figure 19:
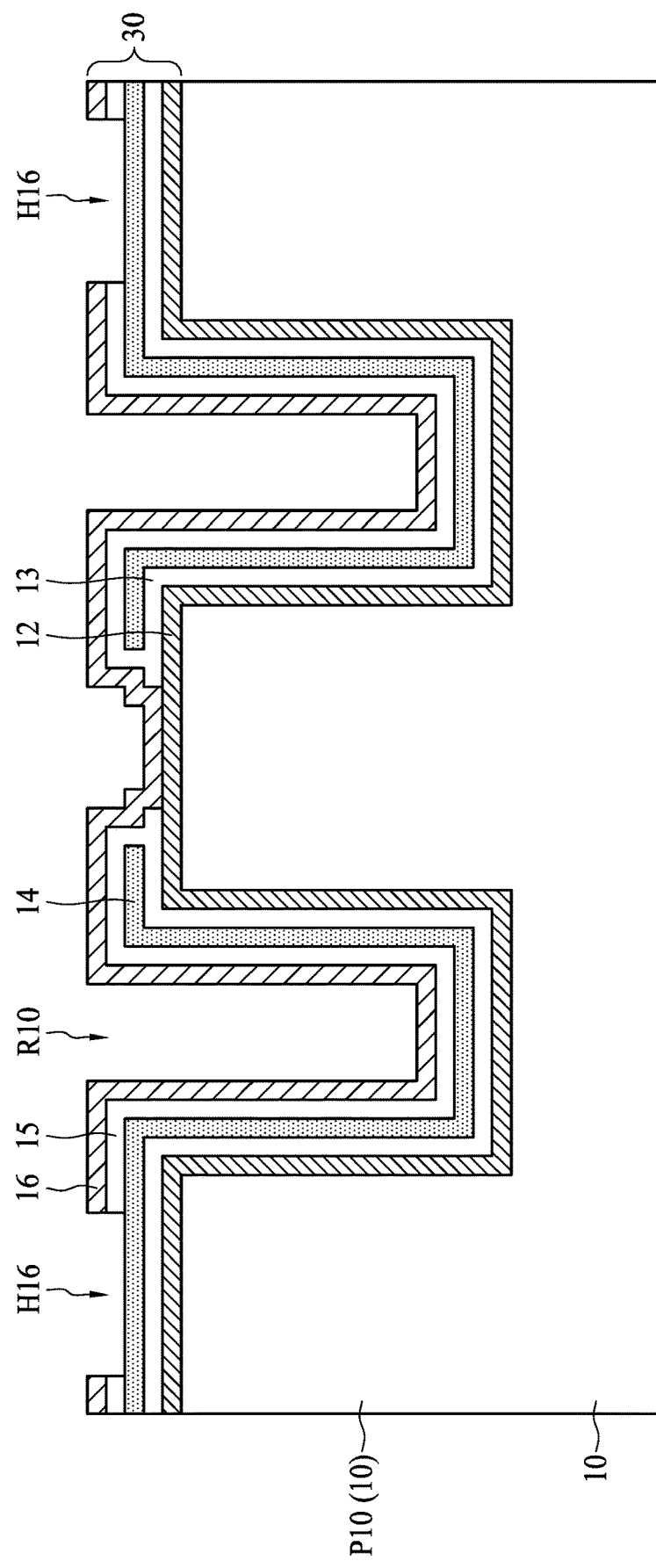

Referring to FIG. 18, an electrode 16 is formed over the dielectric layer and in the recesses R10. The electrode 16 is substantially conformal with respect to a profile of the dielectric layer 15. The electrode 16 is formed in the recesses R10 and in the opening H14'. Referring to FIG. 19, the electrode 16 and the dielectric layer 15 are patterned to remove a portion of the electrode 16 and a portion of the dielectric layer 15. A portion of the electrode 14 is revealed, and an opening H16 is formed and defined by the portion of the electrode 14, a portion of the dielectric layer 13, and a portion of the electrode 16.

Figure 20:
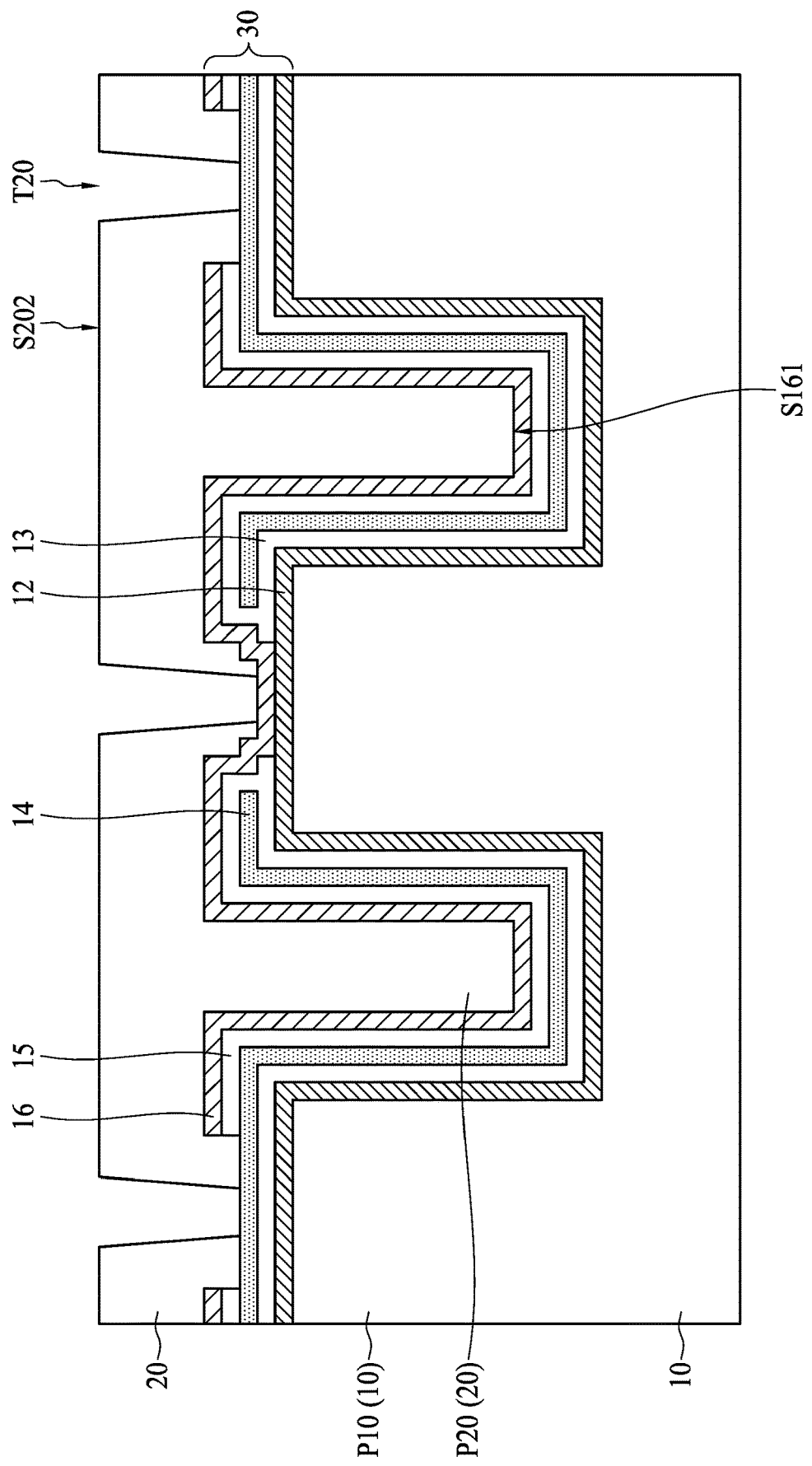
Figure 21:
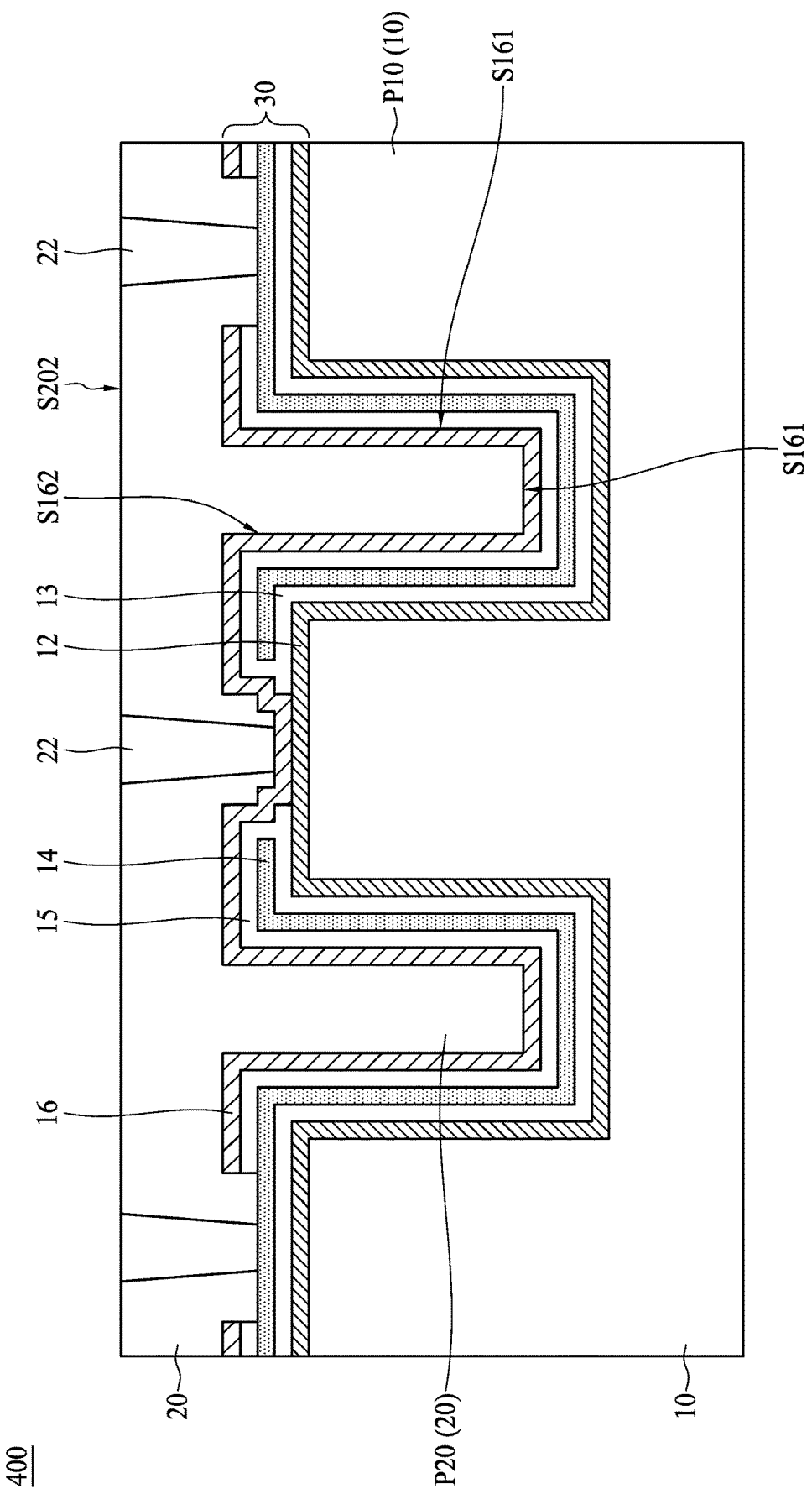

Referring to FIG. 20, another insulative layer 20 is formed over the electrode 16 and filled in the opening H16, opening H14' and the recesses R10. The insulative layer 20 is patterned to form a plurality of trenches T20 to reveal the portion of the electrode 14 in the opening H16 and a portion of the electrode 16 in the opening H14'. Referring to FIG. 21, a plurality of conductive vias 22 is formed in the plurality of trenches T20 to electrically connect with the electrode 16 and the electrode 14 respectively to form the capacitor structure 400. Positions of the conductive vias 22 relative to the electrode 14 and the electrode 16 are not limited herein. The conductive vias 22 can be located in other positions as long as they can respectively be electrically connected to the electrode 16 and the electrode 14. However, the positions of the conductive vias 22 provided in the above description and figures are easy to process in fabrication and can lead to better product yield.

Figure 22:
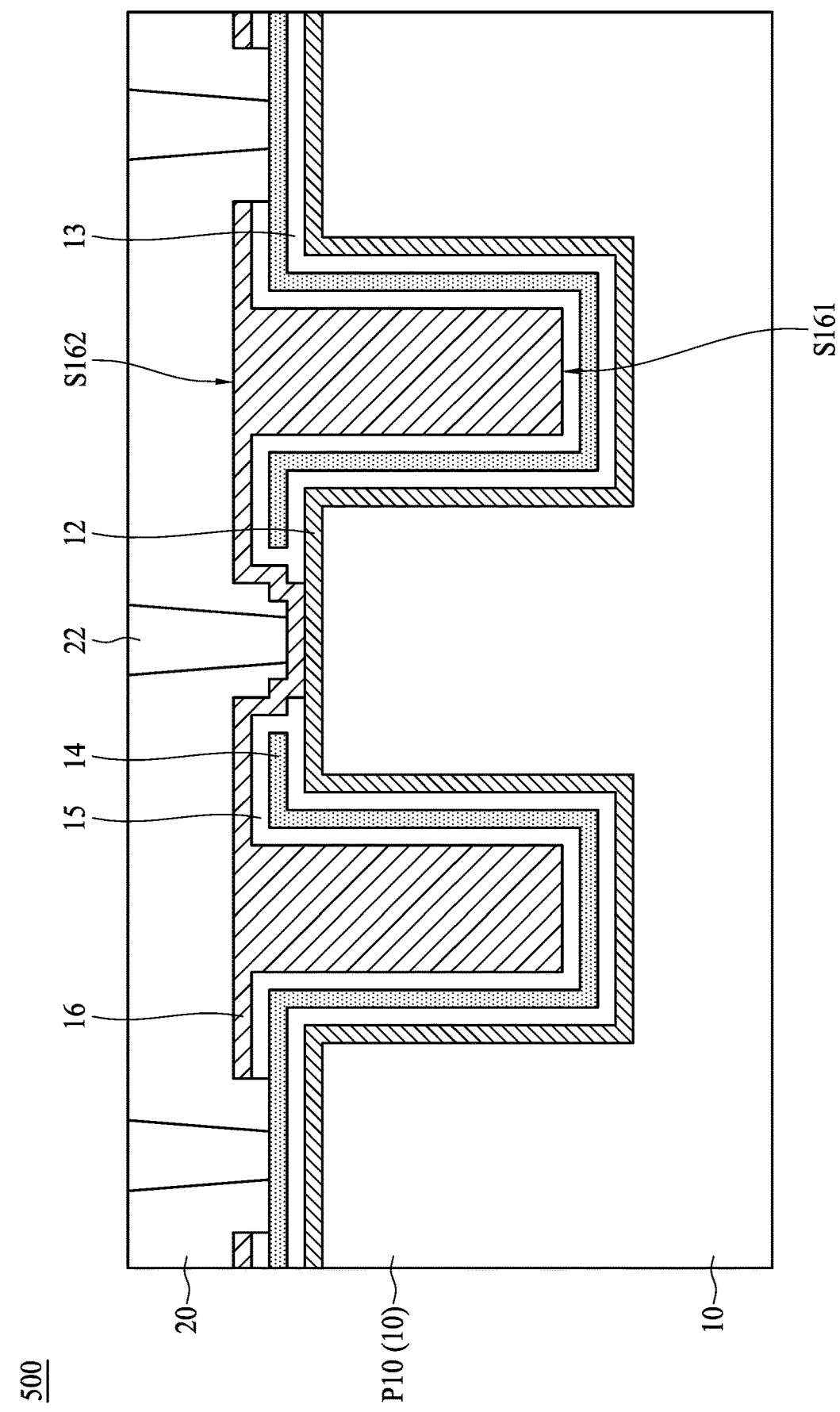
FIG. 22 is a schematic cross sectional view a capacitor structure according to one or more embodiments of the present disclosure.

In some embodiments as shown in FIG. 21, the electrode 16 has a surface S161 proximal to the dielectric layer 15 and a surface S162 distal to the dielectric layer 15. The surface S161 and the surface S162 of the electrode 16 are substantially conformal with respect to a profile of the dielectric layer 15. In other embodiments as shown in FIG. 22, the electrode 16 fills up the recesses R10 in the operation of formation of the electrode 16. Referring to FIG. 22 of a capacitor structure 500 in accordance with some embodiments of the present disclosure, the electrode 16 has a surface S161 proximal to the dielectric layer 15 and a surface S162 distal to the dielectric layer 15, wherein the surface S161 of the electrode 16 is substantially conformal with respect to a profile of the dielectric layer 15, and the surface S162 is a substantially flat surface.

Therefore, the capacitor structure 400 includes the insulative layer 10, the insulative layer 20, the capacitor 30, and a plurality of conductive vias 22. The insulative layer 10 has one or more protrusions P10. The insulative layer 20 is disposed over the insulative layer 10, and the insulative layer 20 has one or more protrusions P20 engaged with the protrusions P10 of the insulative layer 10. The capacitor 30 is located between the insulative layer 10 and the insulative layer 20. The capacitor 30 includes a plurality of electrode and a plurality of dielectric layers. The plurality of electrodes includes the electrode 12, the electrode 14, and the electrode 16. The electrode 14 is interposed between the electrode 12 and the electrode 16. The electrode 12 is electrically connected with the electrode 16. The plurality of dielectric layers includes the dielectric layer 13 and the dielectric layer 15, The electrode 14 is electrically isolated from the electrode 12 by the dielectric layer 13 and from the electrode 16 by the dielectric layer 15. The capacitor 30 is substantially conformal to a profile of the insulative layer 10 and a profile of the insulative layer 20. The plurality of conductive vias 22 is electrically connected with the electrode 16 and the electrode 14.

Figure 23:
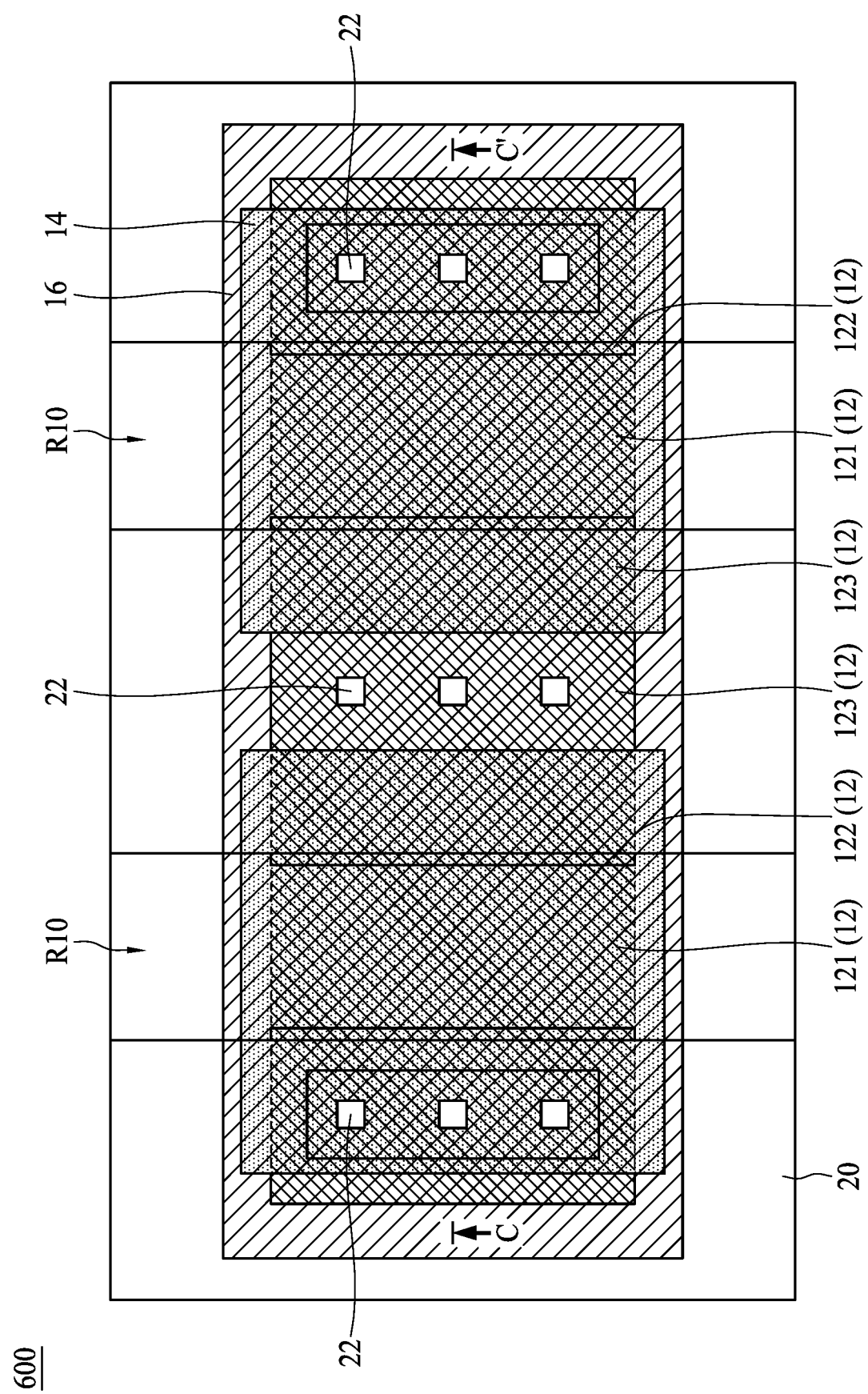
FIGS. 23-24 are schematic top views of capacitor structures according to different embodiments of the present disclosure.
Figure 24:
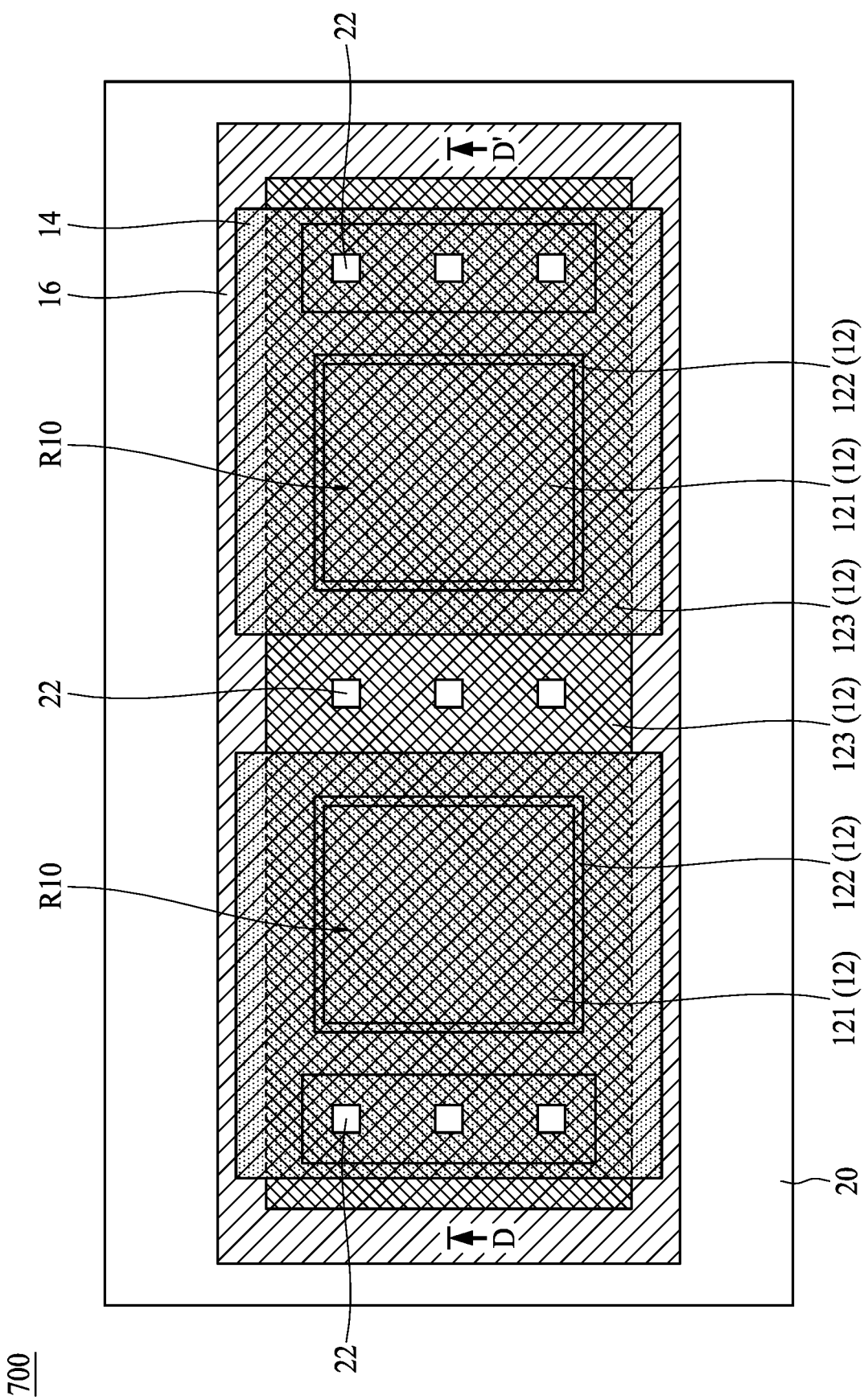

Moreover, depths, widths, lengths, and shapes of the recesses R10 are not limited herein. FIGS. 23-24 are top structural views of a capacitor structure 600 and a capacitor structure 700 in accordance with different embodiments of the present disclosure. The capacitor structure 600 shown in FIG. 23 and the capacitor structure 700 shown in FIG. 24 can be fabricated following afore illustrated method and can share a same cross sectional view. Characteristics and arrangements of the plurality of recesses R10, the electrodes 12 and the electrodes 14 of the capacitor structure 600 are similar to those as illustrated in the capacitor structure 200, and extensive description is omitted for the purpose of brevity, A portion of the electrode 14 is exposed from the electrode 16 and the dielectric layer 15 to be electrically connected with at least one of the plurality of conductive vias 22, The dielectric layer 15 is covered by the electrode 16 and arrangement of the dielectric layer 15 from the top view perspective as shown in FIG. 23 is similar to the electrode 16. A cross sectional view of the capacitor structure 600 along a line C-C' is similar to FIG. 21.

FIG. 24 shows some embodiments of the present disclosure for illustration of a different configuration of the plurality of recesses R10. Characteristics and arrangements of the plurality of recesses R10, the electrodes 12 and the electrodes 14 of the capacitor structure 700 are similar to those as illustrated in the capacitor structure 300, and characteristics and arrangements of the electrode 16 is similar to that of the electrode 16 of the capacitor structure 600. Extensive description is omitted for the purpose of brevity. A cross sectional view of the capacitor structure 700 along a line D-D' is similar to FIG. 21. In other embodiments, the recesses R10 can be other shapes, such as a circle and a square.

Figure 25:
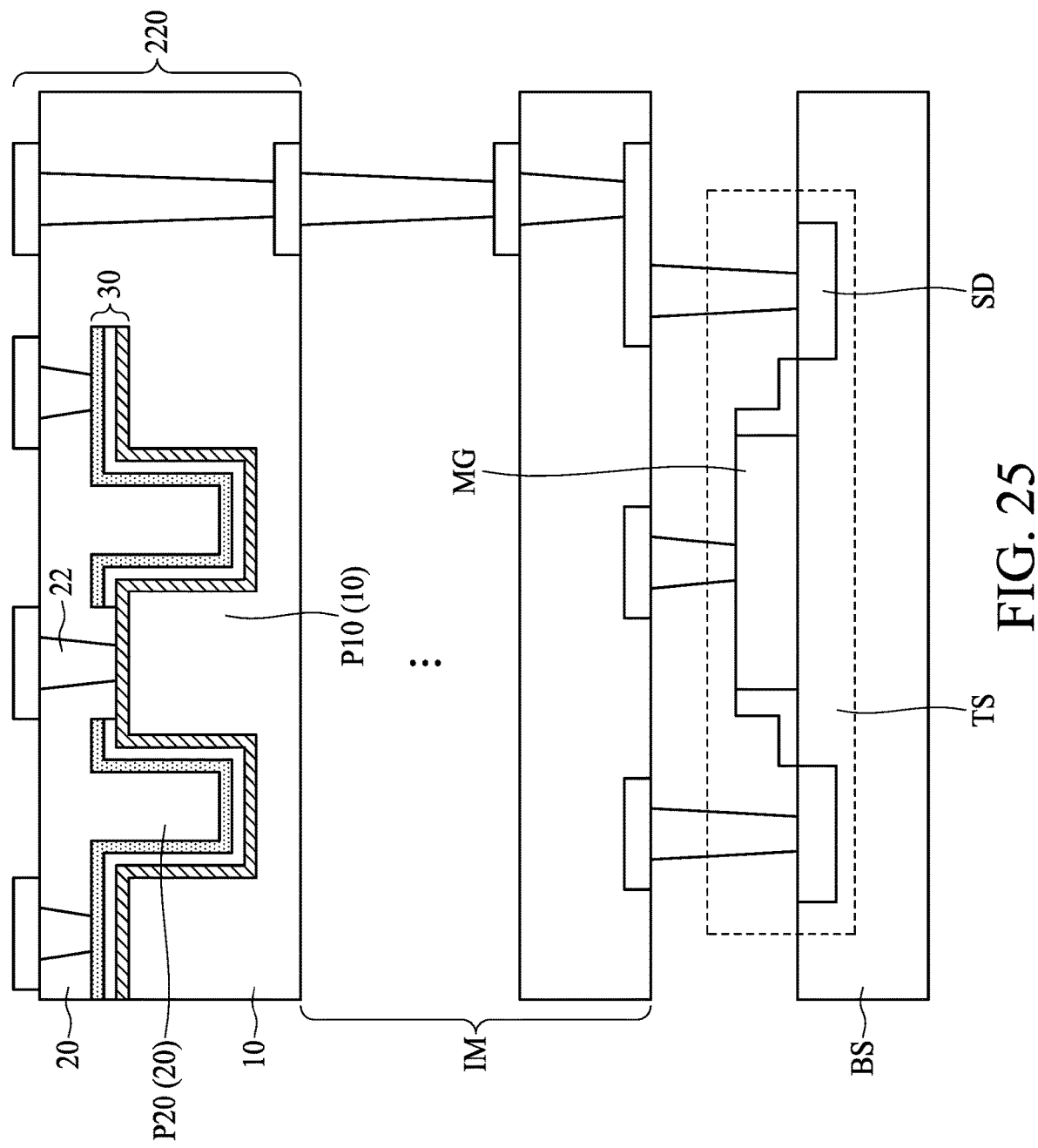
FIG. 25 is a schematic cross sectional view of a semiconductor structure according to some embodiments of the present disclosure.

Therefore, the present disclosure provides a capacitor structure and a method for manufacturing the same. The capacitor structure includes a capacitor extending along a lateral direction and also a depth direction over a base material (can be an insulative layer) so as to increase capacitance. The capacitor structure provided by the present disclosure can be integrated with a semiconductor substrate or a transistor structure. FIG. 25 shows a schematic cross sectional view of a semiconductor structure having a capacitor structure 220 integrated with transistors in accordance with some embodiments of the present invention. The semiconductor structure includes the capacitor structure 220, a substrate BS, a plurality of transistors TS, and a plurality of intermediate layers IM between the plurality of transistors TS and the insulative layer 10. The substrate BS can be a semiconductive substrate, such as polysilicon substrate, SiC (silicon carbide) substrate, ceramic substrate, or other suitable material. The transistors TS can be, for example, planar transistors, fin field effect transistors, metal gate transistors, polysilicon gate transistors, complementary metal oxide semiconductor (CMOS) transistors or combination thereof. The intermediate layers IM can be inter-metal dielectric (MD) layers and includes metal wiring network for interconnection. For the purpose of clarity, one transistor TS is shown. The transistor TS includes a gate structure MG on the substrate BS, a source/drain SD adjacent to the gate structure MG and in the substrate BS and the structure of the transistor TS as shown in FIG. 25 is for illustration but not to restrict the present disclosure. Other capacitor structures of present disclosure can be integrated with other transistors or semiconductor devices.

As shown in FIG. 25, the plurality of intermediate layers IM is for formation of an interconnect structure on the substrate SB and the transistors TS, and some layers of the intermediate layers IM closer to the substrate have relatively smaller thickness and more complex interconnecting network. On the other hand, those intermediate layers IM has a greater distance away from the substrate SB have a relatively greater thickness and simple interconnect structure. Referring to FIG. 25, the capacitor structure 220 can be integrated within one of the intermediate layers IM having greater thickness and simple elements and network, especially one of the upper most intermediate layers IM shown in FIG. 25. In addition, greater thickness of an intermediate layer IM is, larger area of a capacitor structure can be formed, and thus capacitance can be enhanced. It is also easier to control the operations of fabricating the capacitors in a thicker insulative layer than a thinker one, and thus better product yield can be achieved. Therefore, a capacitor structure provided by the present disclosure can be highly integrated with a semiconductor structure, and a method for forming the same can be highly integrated semiconductor manufacturing process.

Therefore; some embodiments of the present disclosure provide a capacitor structure, including: an insulative layer; a first electrode over the insulative layer; a dielectric layer over the first electrode and substantially conformal with respect to a profile of the first electrode; and a second electrode over the dielectric layer. The first electrode includes: a first portion extending along a lateral direction of the insulative layer; and a second portion connected to the first portion and extending along a depth direction of the insulative layer.

Some embodiments of the present disclosure also provide a semiconductor structure. The semiconductor structure includes: a first insulative layer having one or more first protrusions; a second insulative layer being over the first insulative layer, wherein the second insulative layer has one or more second protrusions engaged with the first protrusions of the first insulative layer; and a capacitor between the first insulative layer and the second insulative layer, the capacitor comprising a plurality of electrodes and at least one dielectric layer, wherein the at least one dielectric layer is interposed between two adjacent electrodes of the plurality of electrodes, and the two adjacent electrodes of the plurality of electrodes are electrically isolated from each other by the at least one dielectric layer.

Some embodiments of the present disclosure further provide a method for manufacturing a capacitor structure. The method includes: receiving a first insulative layer having one or more recesses; forming a first electrode over the first insulative layer and in the one or more recesses; forming a first dielectric layer over the first electrode and in the one or more recesses; forming a second electrode over the first dielectric layer and in the one or more recesses, the second electrode being electrically, isolated from the first electrode; and forming a second insulative layer over the second electrode.

The foregoing outlines structures of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A capacitor structure, comprising:
    an insulative layer;
    a first electrode over the insulative layer, the first electrode including:
        a first portion extending along a lateral direction of the insulative layer; and
        a second portion connected to the first portion and extending along a depth direction of the insulative layer, wherein the second portion encircles the first portion from a top view perspective;
    a second electrode over the first electrode; and
    a dielectric layer between the first electrode and the second electrode.

2. The capacitor structure of claim 1, wherein the lateral direction and the depth direction are substantially perpendicular to each other.

3. The capacitor structure of claim 1, wherein the first electrode further comprises a third portion connected to the second portion, and extending along the lateral direction, the third portion and the first portion are disposed at different levels, and the dielectric layer is over and substantially conformal with respect to a profile of a portion of the third portion, the first portion and the second portion of the first electrode.

4. The capacitor structure of claim 3, wherein the second electrode includes a first surface proximal to the dielectric layer, and a second surface distal to the dielectric layer, and the first surface of the second electrode is substantially conformal with respect to a profile of the dielectric layer.

5. The capacitor structure of claim 4, wherein the second surface of the second electrode is substantially conformal with respect to the profile of the dielectric layer.

6. The capacitor structure of claim 4, wherein the second surface of the second electrode is a substantially flat surface and substantially at a same level.

7. The capacitor structure of claim 3, further comprising:
    a first conductive via disposed on and electrically connected to another portion of the third portion of the first electrode, and
    a second conductive via disposed on and electrically connected to second electrode.

8. The capacitor structure of claim 1, further comprising:
a second dielectric layer over the second electrode and substantially conformal with respect to a profile of the second electrode; and
a third electrode over the second dielectric layer.

9. The capacitor structure of claim 8, wherein the third electrode is electrically connected to the first electrode.

10. A semiconductor structure, comprising:
a first insulative layer;
a second insulative layer being over the first insulative layer, wherein the second insulative layer has one or more protrusions toward the first insulative layer; and
a capacitor disposed on the first insulative layer, the capacitor comprising a plurality of electrodes and at least one dielectric layer, wherein the at least one dielectric layer is interposed between two adjacent electrodes of the plurality of electrodes, the two adjacent electrodes of the plurality of electrodes are electrically isolated from each other by the at least one dielectric layer, and the capacitor encircles the one or more protrusions from a top view perspective.

11. The semiconductor structure of claim 10, further comprising:
a substrate;
a plurality of transistors on the substrate; and
a plurality of intermediate layers between the plurality of transistors and the first insulative layer.

12. The semiconductor structure of claim 10, wherein the plurality of electrodes of the capacitor comprises a first electrode, a second electrode and a third electrode, the second electrode is interposed between the first electrode and the third electrode, and the first electrode is electrically connected with the third electrode and is electrically isolated from the second electrode.

13. The semiconductor structure of claim 10, wherein the capacitor is substantially conformal to a profile of the first insulative layer and a profile of the second insulative layer.

14. The semiconductor structure of claim 10, further comprising:
a plurality of conductive vias electrically connected with the plurality of electrodes.

15. A semiconductor structure, comprising:
a substrate; and
a capacitor structure, disposed over the substrate, and comprising:
a first electrode, wriggly extending along an extending direction;
a second electrode, disposed over and being conformal to the first electrode;
a first dielectric layer, disposed between the first electrode and the second electrode;
a third electrode, disposed over the second electrode; and
a second dielectric layer, disposed between the third electrode and the second electrode, wherein the third electrode includes a stepped profile adjacent to a connection between the first dielectric layer and the second dielectric layer, and the stepped profile of the third electrode directly contacts the first dielectric layer.

16. The semiconductor structure of claim 15, further comprising:
a first conductive via disposed on and electrically connected to the third electrode, and
a second conductive via disposed on and electrically connected to second electrode.

17. The semiconductor structure of claim 15, further comprising:
one or more transistors, disposed over the substrate; and
an interconnect structure, disposed over the one or more transistors, and comprising a plurality of intermediate layers.

18. The semiconductor structure of claim 17, wherein a first intermediate layer of the plurality of intermediate layers has a thickness greater than a thickness of a second intermediate layer of the plurality of intermediate layers, and the second intermediate layer is disposed between the first intermediate layer and the one or more transistors.

19. The semiconductor structure of claim 15, wherein at least a portion of the first electrode is exposed through the first dielectric layer and the second electrode.

20. The semiconductor structure of claim 19, wherein the third electrode is in contact with the portion of the first electrode.

* * * * *